(12) United States Patent
Tokiwa

(10) Patent No.: US 7,515,470 B2
(45) Date of Patent: Apr. 7, 2009

(54) SEMICONDUCTOR INTEGRATED CIRCUIT DEVICE

(75) Inventor: Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/118,330

(22) Filed: May 9, 2008

(65) Prior Publication Data

US 2008/0253192 A1 Oct. 16, 2008

Related U.S. Application Data

(63) Continuation of application No. 11/616,112, filed on Dec. 26, 2006, now Pat. No. 7,388,782.

(30) Foreign Application Priority Data

Dec. 26, 2005 (JP) .............................. 2005-373517

(51) Int. Cl.
*G11C 16/06* (2006.01)
(52) U.S. Cl. .............................. 365/185.09; 365/185.11
(58) Field of Classification Search ............. 365/185.09
See application file for complete search history.

(56) References Cited

U.S. PATENT DOCUMENTS

| | | | |
|---|---|---|---|
| 6,108,246 A | 8/2000 | Umezawa et al. | |
| 6,157,573 A * | 12/2000 | Ishii et al. ............... | 365/185.24 |
| 6,462,985 B2 | 10/2002 | Hosono et al. | |
| 6,646,930 B2 | 11/2003 | Takeuchi et al. | |
| 6,671,204 B2 * | 12/2003 | Im ......................... | 365/185.12 |
| 6,751,122 B2 | 6/2004 | Kawai et al. | |
| 6,898,119 B2 * | 5/2005 | Imamiya et al. ........ | 365/185.09 |
| 7,437,602 B2 * | 10/2008 | Asari et al. .................... | 714/6 |
| 2001/0008498 A1 | 7/2001 | Ooishi | |
| 2003/0169630 A1 * | 9/2003 | Hosono et al. .............. | 365/200 |
| 2004/0042331 A1 | 3/2004 | Ikehashi et al. | |
| 2005/0018483 A1 | 1/2005 | Imamiya et al. | |
| 2005/0188147 A1 | 8/2005 | Tanaka | |
| 2006/0198201 A1 * | 9/2006 | Miwa et al. ............. | 365/185.28 |
| 2007/0183200 A1 * | 8/2007 | Tsuruda .................. | 365/185.08 |

FOREIGN PATENT DOCUMENTS

| | | |
|---|---|---|
| JP | 2000-91505 | 3/2000 |
| JP | 2005-216345 | 8/2005 |

* cited by examiner

*Primary Examiner*—Son L Mai
(74) *Attorney, Agent, or Firm*—Oblon, Spivak, McClelland, Maier & Neustadt, P.C.

(57) ABSTRACT

A semiconductor integrated circuit device includes a memory cell array having a plurality of blocks, a storage unit, a block replacement information register group, and a bad block flag register group. The storage unit includes a block replacement information registration area with which it is possible to register block replacement information, and a bad block information registration area with which it is possible to register bad block information. The block replacement information register group is set in accordance with the block replacement information read out of the storage unit during a boot sequence, and the bad block flag register group is set in accordance with both of the block replacement information and the bad block information read out of the storage unit during the boot sequence.

16 Claims, 29 Drawing Sheets

Reference example 1

FIG. 2  Reference example 2

First embodiment

Reference examples 1 and 2

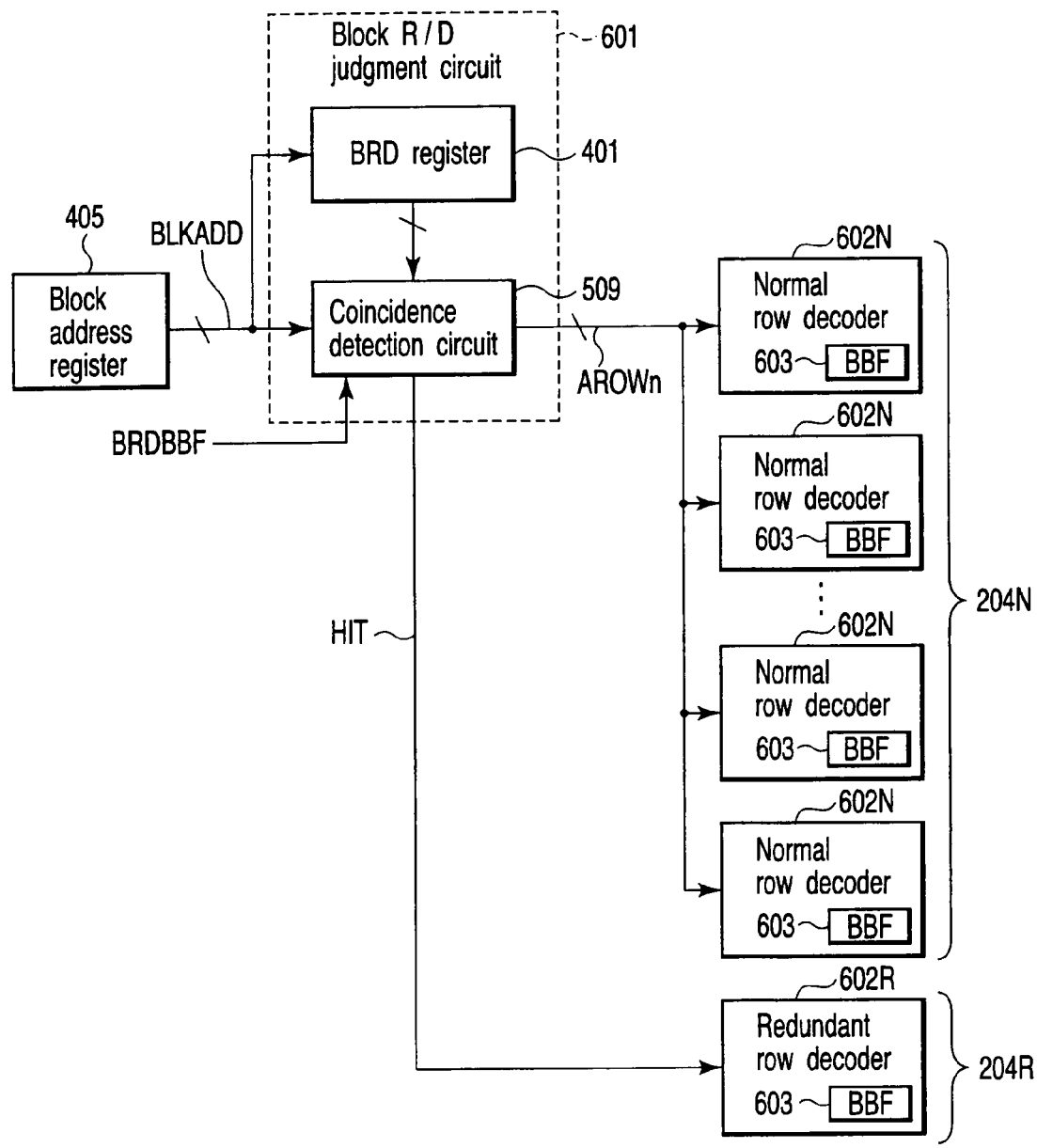
F I G. 21

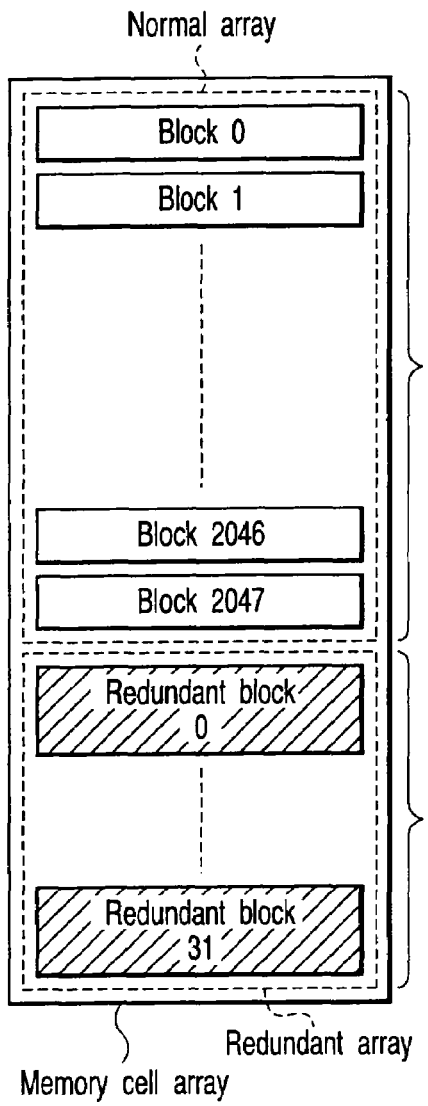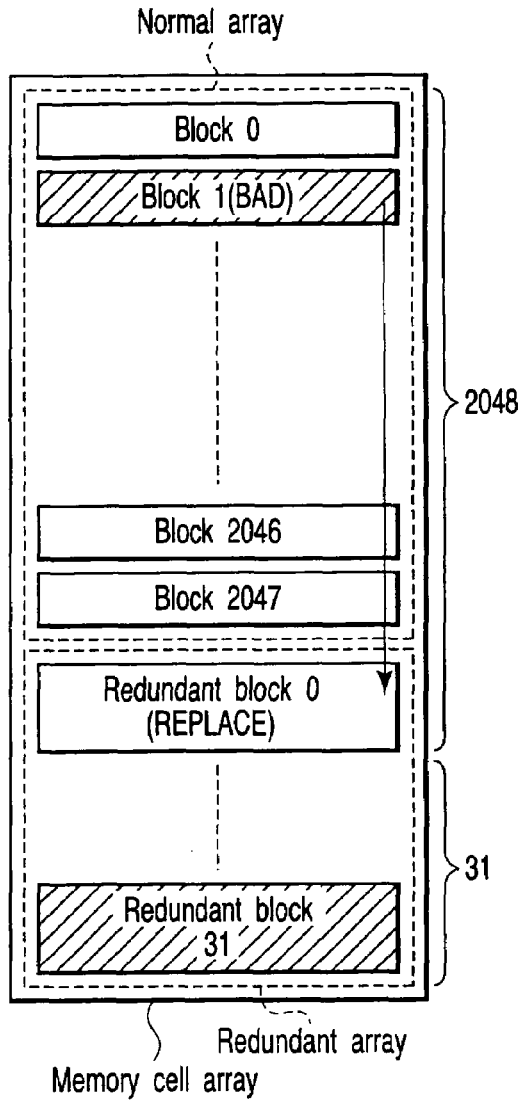
FIG. 22A   FIG. 22B
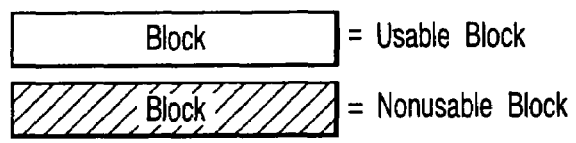
FIG. 22C

Reference example

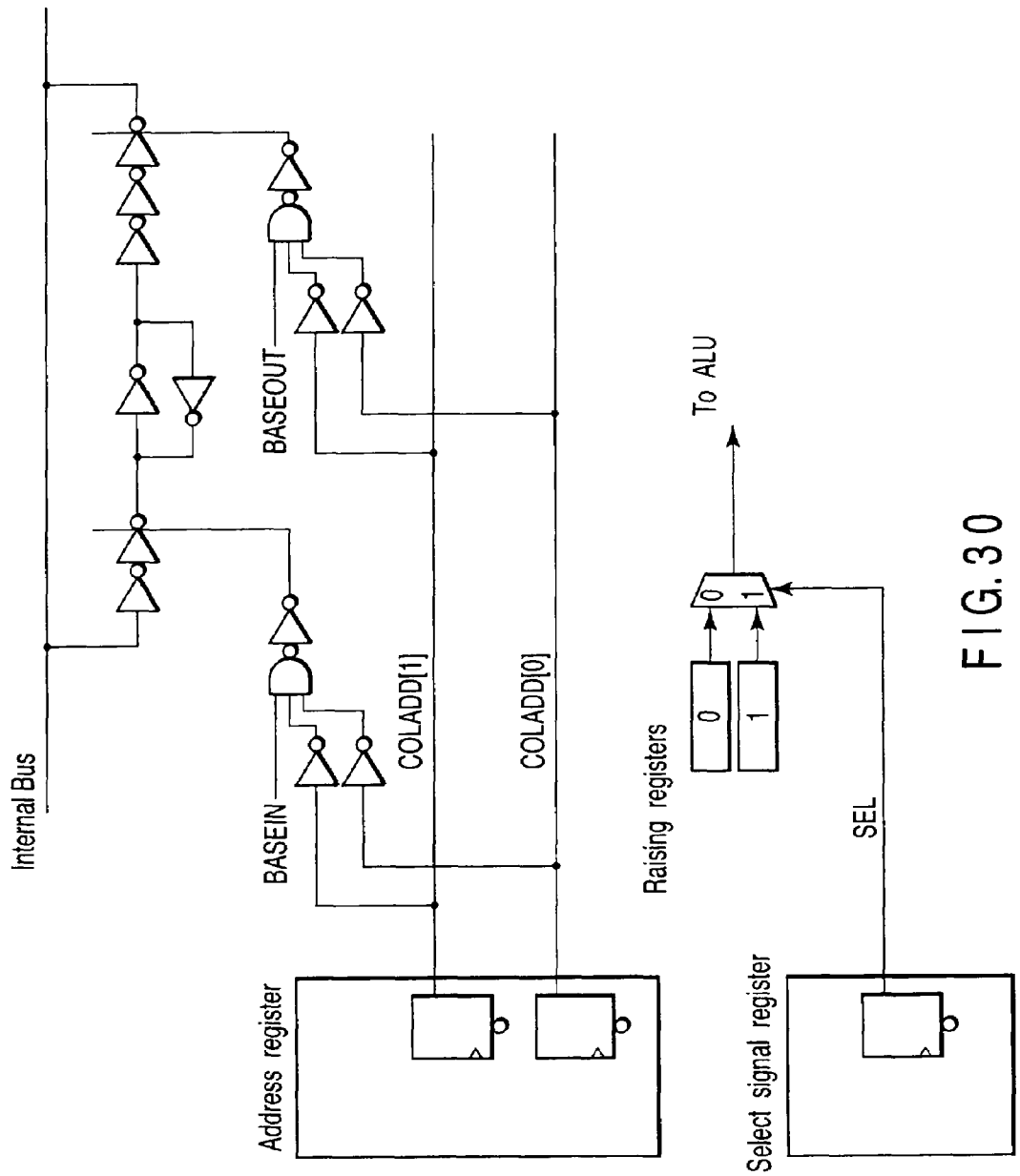
F I G. 3 0

| Pin No. | Signal |
|---|---|
| Pin 1 | Card detection / Data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

| | | |
|---|---|---|
| SD mode 4bit | DAT 3 | CD / DATA |
| | DAT 2 | DATA |
| | DAT 1 | DATA |
| | DAT 0 | DATA |
| | CMD | Command / Response |
| | CLK | Clock |
| SD mode 1bit | DAT 3 | Reserved |
| | DAT 2 | Unused |
| | DAT 1 | Unused |
| | DAT 0 | DATA |
| | CMD | Command / Response |
| | CLK | Clock |
| SPI mode | DAT 3 | Chip select CS |
| | DAT 2 | Unused |
| | DAT 1 | Unused |
| | DAT 0 | DATA OUT |
| | CMD | DATA IN |
| | CLK | Clock |

FIG. 37

SEMICONDUCTOR INTEGRATED CIRCUIT DEVICE

CROSS-REFERENCE TO RELATED APPLICATIONS

This application is a continuation of and claims the benefit of priority under 35 U.S.C. §120 from U.S. Ser. No. 11/616,112 filed Dec. 26, 2006, and claims the benefit of priority under 35 U.S.C. §119 from Japanese Patent Application No. 2005-373517 filed Dec. 26, 2005, the entire contents of each of which are incorporated herein by reference.

BACKGROUND OF THE INVENTION

1. Field of the Invention

The present invention relates to a semiconductor integrated circuit device, and in particular, to a semiconductor integrated circuit device having a nonvolatile semiconductor memory.

2. Description of the Related Art

In a nonvolatile semiconductor memory utilized for a recording medium such as a memory card or the like, a redundancy technique is used. The redundancy technique is a technique in which a column (defective column) or a block (defective block) which has brought about a defect in manufacturing is replaced by a spare column (redundant column) or a spare block (redundant block). In accordance therewith, even when there is a column or a block which has brought about a defect in manufacturing, this is relieved by the one being replaced by a spare column or a spare block, and it is possible to maintain an yield of the nonvolatile semiconductor memory, which makes it possible to improve the yield.

In a recent redundancy technique, redundancy information, for example, block replacement information including address information of defective blocks and block information of replacement destinations, or the like in a case of block replacement is stored in an internal ROM, and the block replacement information is read out of the internal ROM during a boot sequence at the time of power-on, and is set in a register (Jpn. Pat. Appln. KOKAI Publication No. 2000-091505). The redundancy information is set in the register because, if the redundancy information is read out of the internal ROM at every access, an access speed may be lowered. A boot sequence is internal processing for a system start-up in a nonvolatile semiconductor memory chip at the time of power-on. Note that the reason why redundancy information is stored in the internal ROM is that it has become difficult to carry out a program such as, for example, a laser beam welding type fusing or the like, i.e., a program involving mechanical fracture in accordance with miniaturization of integrated circuits and large-scale designing of storage capacities.

Moreover, in recent years, as information to be stored in an internal ROM, not only redundancy information, but also trimming information and the like have been included. Trimming information is information for optimizing the setting of a voltage and the like for each chip, or for each production lot by calculating on production tolerance among chips or among production lots.

Further, all information to be read during a boot sequence is once read out of the internal ROM to be stored in a data cache. Thereafter, from the data cache, the redundancy information is transferred to a resister in which redundancy information is set, and the trimming information is transferred to a resister in which trimming information is set.

Moreover, recently, separately from the redundancy technique, the concept of bad block has been newly put to practical use. Bad block is a technique in which a block that has brought about a defect in manufacturing (defective block) is not replaced by a redundant block, but instead disabled. Because a bad block is disabled, a storage capacity is reduced by an amount of the capacity thereof. However, a recent nonvolatile semiconductor memory has a large storage capacity, which means that it has a large number of blocks, and thus there are many blocks unused by a user. To think of this actual situation, a bad block technique is inoffensive from a practical standpoint. In contrast, as compared with nonvolatile semiconductor memories which do not use a bad block technique, it is possible to increase the number of shipments, which makes it possible to provide nonvolatile semiconductor memories inexpensively to users.

Moreover, there has been an attempt to abolish redundancy technique, and to apply bad block technique to all blocks (Jpn. Pat. Appln. KOKAI Publication No. 2005-216345).

Bad block information utilized for the bad block technique as well is one of information utilized during a boot sequence. With respect to a block which has been disabled in accordance with bad block information, when this is accessed, processing in which voltages required for the respective operations of erasing of data, writing of data, and reading of data are not applied to a word line is carried out.

A defective block and a bad block have the same feature in that the both are blocks having brought about defects. However, the redundancy technique is a technique in which a defective block is replaced by a redundant block, and the bad block technique is a technique in which the defective block is disabled. These techniques are different from each another.

For example, in the redundancy technique, when a defective block is accessed, the access is automatically transferred to a redundant block serving as a replacement destination, and the redundant block serving as a replacement destination is accessed. Namely, the defective block is not accessed. Accordingly, the defective block is handled in the same way as other unselected blocks. With respect to a word line of the defective block, voltages required for the respective operations of erasing of data, writing of data, and reading of data are not applied in the same way as the other unselected blocks. In accordance with the redundancy technique, because a defective block is handled in the same way as other unselected blocks, a circuit for controlling voltages applied to word lines is not required.

In contrast thereto, in accordance with the bad block technique, a bad block is handled in the same way as a selected block. Accordingly, because the bad block is accessed, and voltages required for the respective operations of erasing of data, writing of data, and reading of data are applied to a word line thereof. This situation is forcibly restrained on the basis of a flag, in concrete terms, a bad block flag. Therefore, a voltage control circuit for forcibly restraining voltages applied to the word lines is required. However, in the bad block technique, voltages applied to the word lines are forcibly restrained. Thus, with respect to a block which has been registered as a bad block, no voltage is applied to a word line thereof at all even at the time of erasing it, in particular, at the time of batch erasing of the chip.

In this way, voltages applied to word lines are not controlled in the redundancy technique, but voltages applied to word lines are controlled in the bad block technique. Therefore, registers set on the basis of the redundancy information and registers set on the basis of the bad block information are different from each other. As a concrete example, registers in which redundancy information is set are built into an address system circuit, and registers in which bad block information is set are built into a word line system circuit.

With respect to the redundancy information and the bad block information, a redundancy information registration area with which redundancy information is registered, and a bad block information registration area with which bad block information is registered are assigned to the internal ROM, and those are respectively stored therein separately. Data storage addresses in a data cache are made different depending on redundancy information or bad block information. Then, transfer of information to the registers and setting of the registers are respectively carried out by separate operations.

Moreover, recently, it has been believed that a defective block as well is preferably handled in the same way as a bad block. For example, with respect to a defective block according to the redundancy technique, an access to the defective block could be permitted at the time of batch erasing of the chip. In this case, a short-circuit current or the like is expected to occur, and there is a possibility that a power supply capacity is deteriorated, or the chip is broken at worst. Then, a defective block as well is handled in the same way as a bad block, in which case a voltage is not applied to a word line at all even at the time of batch erasing of the chip.

Then, addresses of blocks which have been regarded as defective blocks in manufacturing are registered as bad blocks with the bad block registration area before shipment at the manufacturer side.

However, addresses of the defective blocks and addresses of the bad blocks are redundantly registered with the internal ROM. Namely, the usage rate of the bad block registration area is increased. Therefore, when many redundant blocks are utilized, all of the number of blocks which can be registered as bad blocks cannot be utilized in some cases, which loses a yield thereof.

BRIEF SUMMARY OF THE INVENTION

A semiconductor integrated circuit device according to a first aspect of the present invention comprises: a memory cell array into which a nonvolatile semiconductor memory is integrated, and which includes a plurality of blocks; a storage unit which includes a block replacement information registration area with which it is possible to register block replacement information including address information of a defective block among said plurality of blocks, and a bad block information registration area with which it is possible to register bad block information including address information of a bad block; a block replacement information register group into which the block replacement information is set, the block replacement information register group being set in accordance with the block replacement information read out of the storage unit during a boot sequence; a bad block flag register group into which the bad block information is set, the bad block flag register group being set in accordance with both of the block replacement information and the bad block information read out of the storage unit during the boot sequence; a block redundancy judgment circuit which compares an inputted block address and the block replacement information set in the block replacement information register, and which can transfer an access destination to a redundant block serving as a replacement destination from the defective block when the defective block is accessed; a row decoder with a voltage restraining function which can restrain a voltage applied to a word line of the bad block in accordance with the bad block information set in the bad block flag register group when the bad block is accessed; a power supply detecting circuit which detects power-on; and a sequencer which executes a boot sequence after the power supply detecting circuit detects power-on.

A semiconductor integrated circuit device according to a second aspect of the present invention comprises: a memory cell array into which a nonvolatile semiconductor memory is integrated, and which includes a plurality of blocks; a storage unit which includes a trimming information registration area with which it is possible to register a plurality of trimming information including base values; a base register group which includes a plurality of base registers into which the base values of said plurality of trimming information are set; a first selection signal generating circuit which generates a first selection signal for selecting said plurality of base registers; a raising register group which includes a plurality of raising registers into which a plurality of raising values are set; a second selection signal generating circuit which generates a second selection signal for selecting said plurality of raising registers; and an arithmetic and logical unit which carries out logical operation of the base values set into the base registers, and the raising values set into the raising registers, wherein, after the base values of said plurality of trimming information are set into the base register group, logical operation of a base value set into a base register selected by the first selection signal and a raising value set into a raising register selected by the second selection signal is carried out by the arithmetic and logical unit, and a calculated result by the arithmetic and logical unit is returned to the base register selected by the first selection signal.

A semiconductor integrated circuit device according to a third aspect of the present invention comprises: a memory cell array into which a nonvolatile semiconductor memory is integrated, which includes a plurality of blocks, and which includes a normal array including blocks which are not used as a redundant block, and a redundant array including blocks which can be used as the redundant block; a storage unit which includes a block replacement information registration area with which it is possible to register block replacement information including address information of a defective block among said plurality of blocks, and a bad block information registration area with which it is possible to register bad block information including address information of a bad block; a block replacement information register group into which the block replacement information is set during a boot sequence; a bad block flag register group into which the bad block information is set during the boot sequence; a block redundancy judgment circuit which compares an inputted block address and the block replacement information set in the block replacement information register, and which can transfer an access destination to a redundant block serving as a replacement destination from the defective block when the defective block is accessed; a row decoder with a voltage restraining function which can restrain a voltage applied to a word line of the bad block in accordance with the bad block information set in the bad block flag register group when the bad block is accessed; a power supply detecting circuit which detects power-on; a sequencer which executes the boot sequence after the power supply detecting circuit detects power-on; and a command decoder which decodes commands, wherein the commands include a first command designating a first type in which the memory cell array is operated so as to be divided into a normal array and a redundant array, and a second command designating a second type in which the entire memory cell array is operated as a normal array, and the command decoder permits an operation of transferring an access destination of the block redundancy judgment circuit during setting of the block replacement information register group during the boot sequence, and in operation when the first command is received, and prohibits the operation of transferring an access destination of the block redundancy judgment circuit in operation when the second command is received.

BRIEF DESCRIPTION OF THE SEVERAL VIEWS OF THE DRAWING

FIG. 21 is a block diagram showing one example of a semiconductor integrated circuit device according to a fourth embodiment of the present invention;

FIGS. 22A to 22C are diagrams showing a first type which can be employed by a semiconductor integrated circuit device according to a fifth embodiment of the present invention;

FIG. 30 is a circuit diagram showing one example of the semiconductor integrated circuit device according to the sixth embodiment;

FIG. 37 is a diagram showing one example of assignment of signals with respect to signal pins in accordance with operating modes.

DETAILED DESCRIPTION OF THE INVENTION

Figure 1:
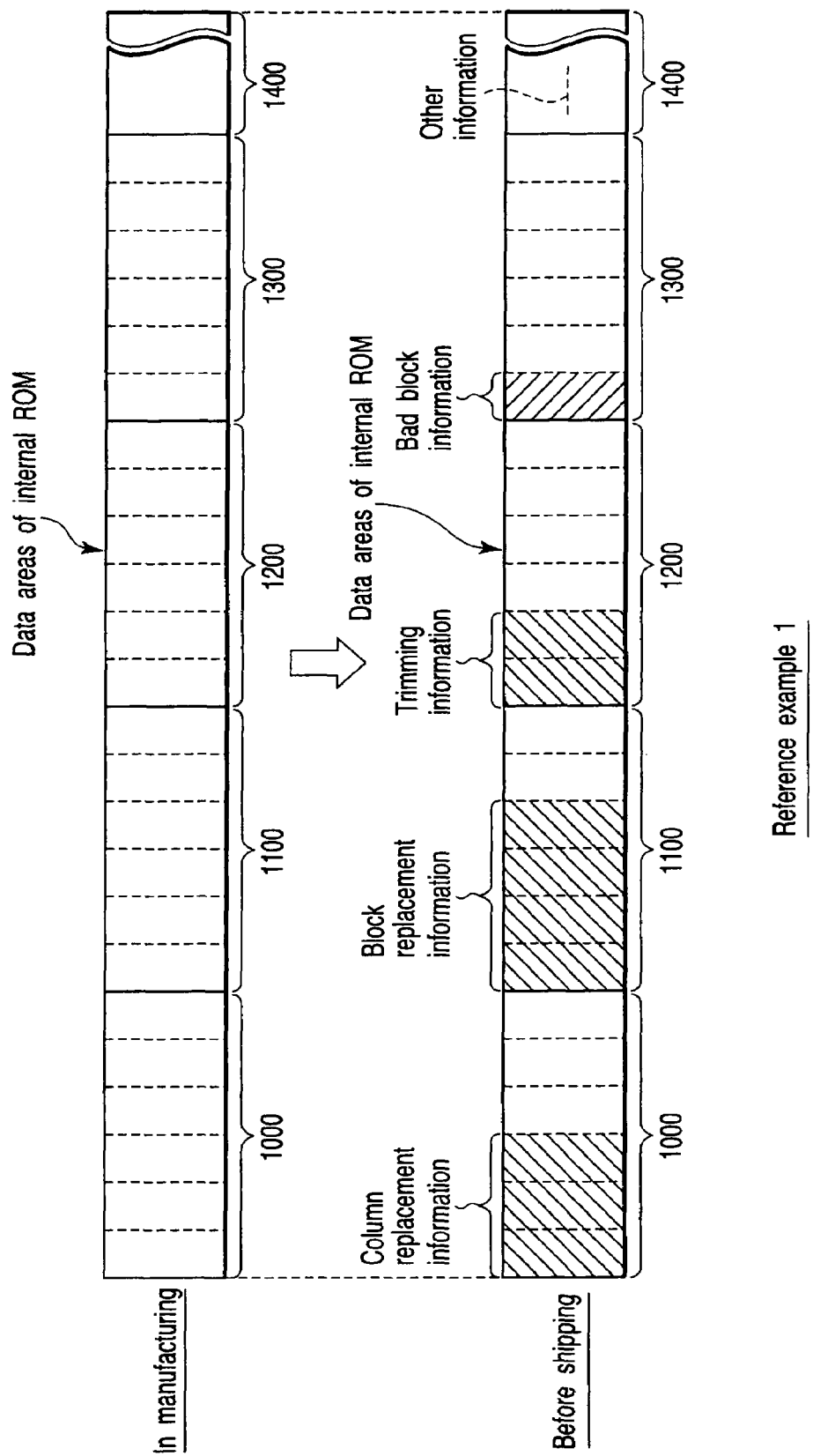
FIG. 1 is a diagram showing assignment of data areas in an internal ROM and a state of registration of data according to a reference example 1.

Hereinafter, embodiments of the present invention will be described with reference to the drawings. Note that, in the drawings, portions which are the same are denoted by the same reference numerals.

As a preliminary of description of the embodiments, main terms used in the embodiments will be defined.

Normal Block
A block prepared as a standard.

Redundant Block
A block prepared as a backup.

Defective Block
A block which has brought about a defect in manufacturing. A defective block is replaced by a redundant block.

Bad Block
A block which has brought about a defect in manufacturing. A bad block is not replaced by a redundant block. A block which cannot be used before shipping.

First, as a reference example of the present embodiment, information used during a boot sequence, and assignment of data areas in an internal ROM will be described.

FIG. 1 is a diagram showing assignment of data areas in an internal ROM and a state of registration of data according to a reference example 1.

The reference example 1 is of an orthodox type. In the internal ROM, as shown in FIG. 1, for example, data areas of a column replacement information registration area 1000, a block replacement information registration area 1100, a trimming information registration area 1200, and a bad block information registration area 1300 are assigned. When there is information except for those (other information), a registration area 1400 may be assigned thereto. Column replacement information and block replacement information are redundancy information. The column replacement information is registered with the column replacement information registration area 1000, and the block replacement information is registered with the block replacement information registration area 1100. In manufacturing, no information is registered with the data areas 1000 to 1400 of the internal ROM. When defective columns and defective blocks are detected at a stage of product inspection, these are replaced by redundant columns and redundant blocks. A manufacturer registers column replacement information and block replacement information for the replacement with the column replacement information registration area 1000 and the block replacement information registration area 1100 before shipment. Trimming information is registered with the trimming information registration area 1200. Trimming information is determined for each product (each chip) or for each production lot on the basis of a result of an operation test at a stage of product inspection. A manufacturer registers trimming information as well with the trimming information registration area 1200 before shipment. Moreover, blocks which have defects in the same way as defective blocks, but are not replaced by redundant blocks, are disabled as bad blocks. Bad block information for disabling is registered with the bad block information registration area 1300.

Figure 2:
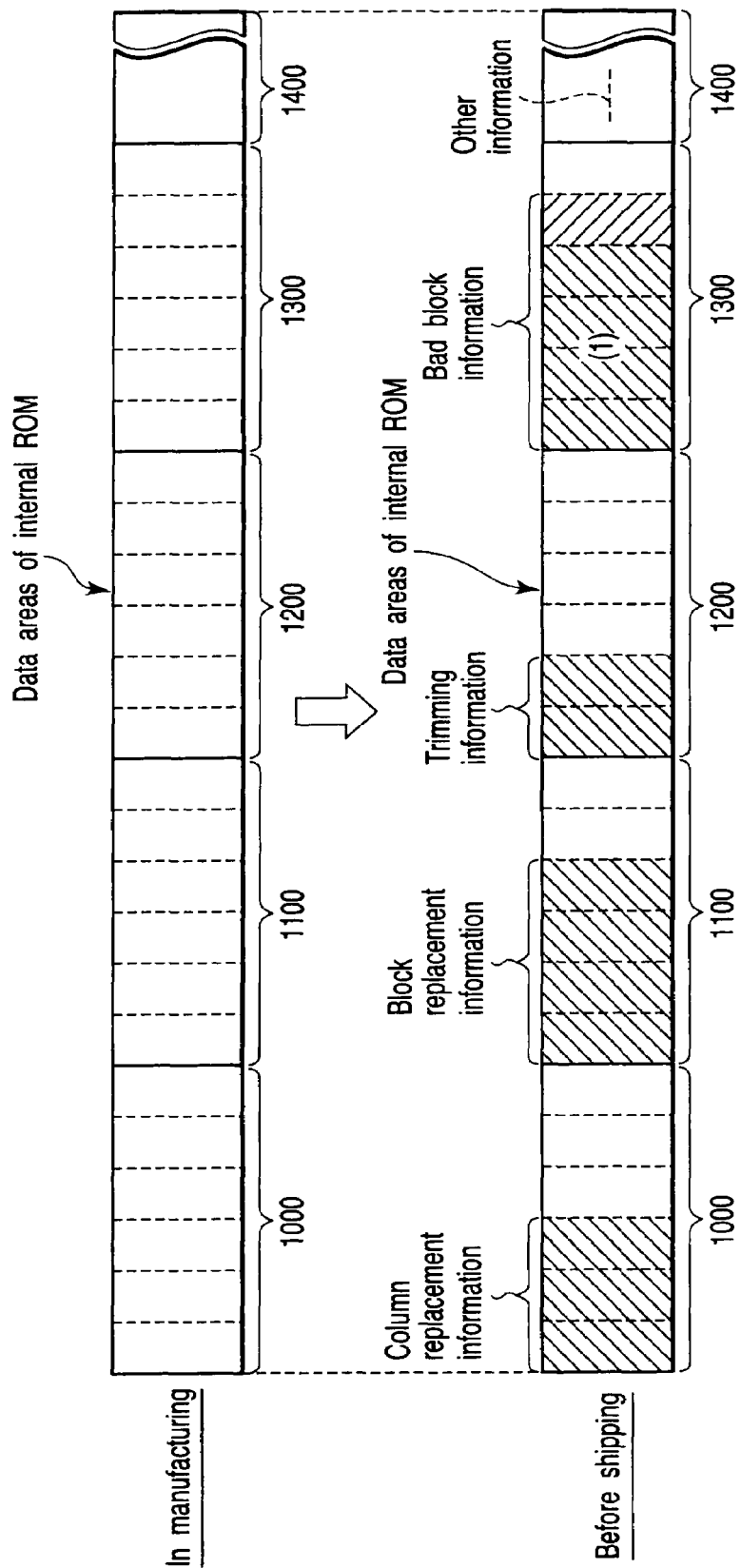
FIG. 2 is a diagram showing assignment of data areas in an internal ROM and a state of registration of data according to a reference example 2.

FIG. 2 is a diagram showing assignment of data areas in an internal ROM and a state of registration of data according to a reference example 2.

The reference example 2 is of a type in which defective blocks are further registered as bad blocks. As shown in FIG. 2, assignment of data areas to the internal ROM is the same as that of the reference example 1 shown in FIG. 1. However, there is a difference in that defective blocks are handled as bad blocks. Therefore, in the reference example 2, bad block information (1) by which defective blocks are handled as bad blocks is registered with the bad block information registration area 1300. The number of utilizable bad blocks registered is shown for convenience in FIGS. 1 and 2. In the present example, for example, it is "6". In the reference example 1 shown in FIG. 1, all the number of utilizable bad blocks registered can be used. In contrast thereto, in the reference example 2 shown in FIG. 2, the four blocks of the number of utilizable bad blocks registered have been already used. Therefore, only the remaining two blocks can be used.

One example is cited as this case. Suppose that a maximum number of usable redundant blocks=32 blocks, and a maximum number of registerable bad blocks=40 blocks. If all the 32 redundant blocks are used, information of 32 blocks is registered with the bad block registration area 1300. For example, if information of 40 blocks can be registered with the bad block registration area 1300, the remaining blocks are 8 blocks. Although 40 blocks can be registered under normal circumstances, only 8 blocks can be registered. This deteriorates a yield.

In order to prevent this problem, it is recommended that information of 32+40 blocks be able to be registered with the bad block registration area 1300, which means that the internal ROM is not necessarily efficiently used.

Then, in a semiconductor integrated circuit device of a type in which defective blocks are registered as bad blocks according to a first embodiment, it is possible to efficiently utilize the internal ROM.

As one example to realize it, a flow of a boot sequence is changed. This example will be described as the first embodiment hereinafter.

FIRST EMBODIMENT

First, one example of an internal system executing a boot sequence will be described.

Figure 3:
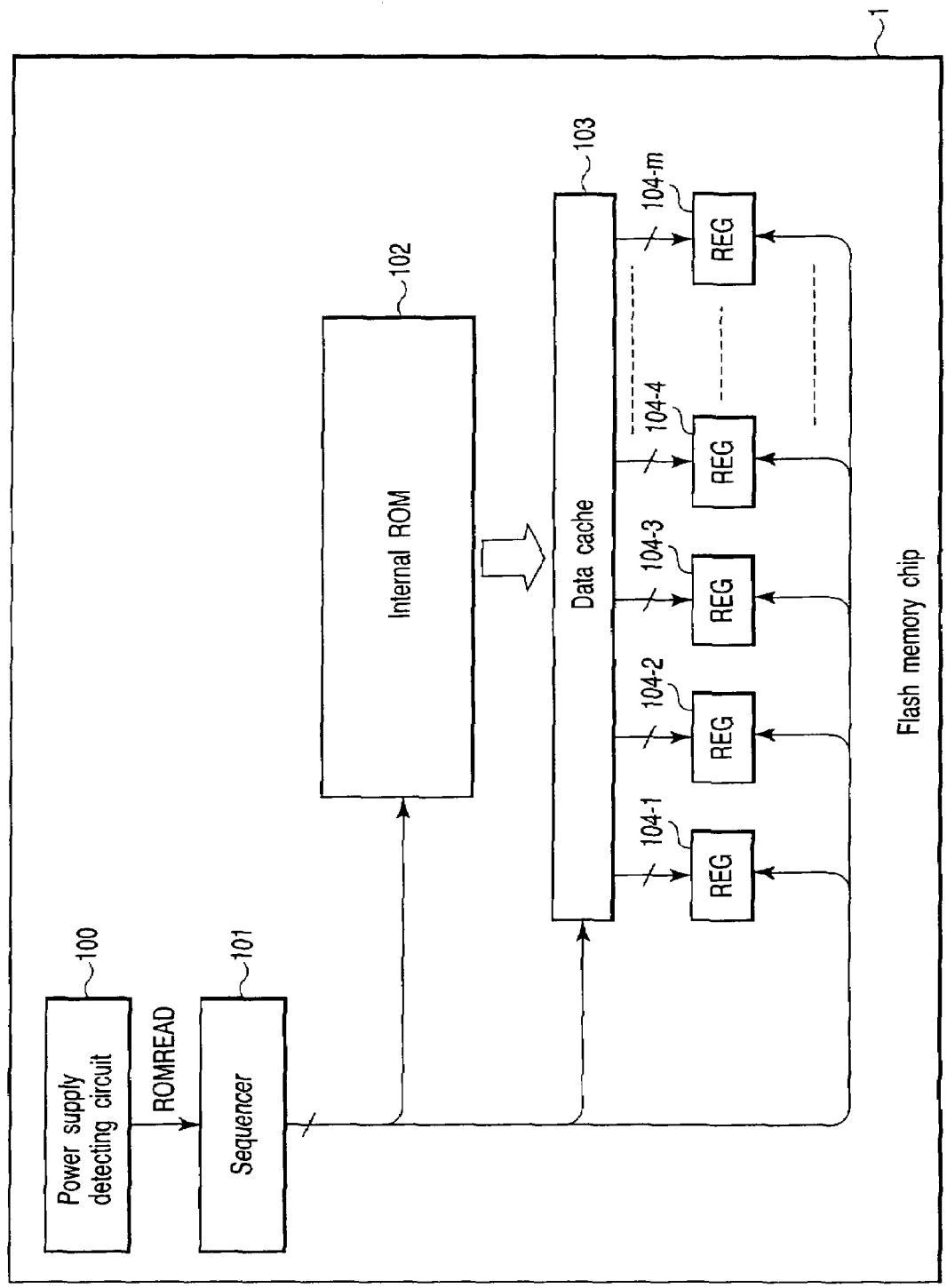
FIG. 3 is a block diagram showing one example of an internal system executing a boot sequence, which is provided in a semiconductor integrated circuit device according to a first embodiment of the present invention.

FIG. 3 is a block diagram showing one example of the internal system executing a boot sequence, which is provided in a semiconductor integrated circuit device according to the first embodiment of the present invention.

As shown in FIG. 3, the internal system executing a boot sequence is built into a nonvolatile semiconductor memory chip, for example, a flash memory chip 1. One example of a flash memory is a NAND type flash memory. The internal system includes a power supply detecting circuit 100, a sequencer 101, an internal ROM 102, a data cache 103, and a register groups 104-1 to 104-m.

Information utilized for a boot sequence is registered with the internal ROM 102. The information utilized for a boot sequence includes column replacement information, block replacement information, trimming information, and bad block information in the present example. Other information may be, if any, further included. Accordingly, assignment of data areas in the internal ROM 102 may be the same as, for example, that in the reference example 1 shown in FIG. 1. Note that, in this specification, the information utilized for a boot sequence is called fuse data hereinafter.

The register groups 104-1 to 104-m are provided so as to correspond to the column replacement information, the block replacement information, the trimming information, and the bad block information which are included in the fuse data. For example, in the present example, the column replacement information is stored in the register group 104-1, the block replacement information is stored in the register group 104-2, the trimming information is stored in the register group 104-3, and the bad block information is stored in the register group 104-4. Note that the register group 104-4 is called a bad block flag register group. When there is other information, it may be stored in a register group other than the register groups 104-1 to 104-4 among the m register groups.

The power supply detecting circuit 100 is a circuit detecting a rising edge of a power supply, i.e., power-on. When the power supply detecting circuit 100 detects power-on, the sequencer 101 starts operations. The sequencer 101 is a control circuit, and controls the internal ROM 102, the data cache 103, and the register groups 104-1 to 104-m in the present example. For example, when the power supply detecting circuit 100 detects power-on, the sequencer 101 issues to the internal ROM 102 an order of reading the fuse data, and hereinafter, sequentially issues to the internal ROM 102 and the data cache 103 orders of transferring the fuse data and retaining the fuse data, and issues to the data cache 103 and the register groups 104-1 to 104-m orders of transferring the fuse data and storing the fuse data.

Figure 4:
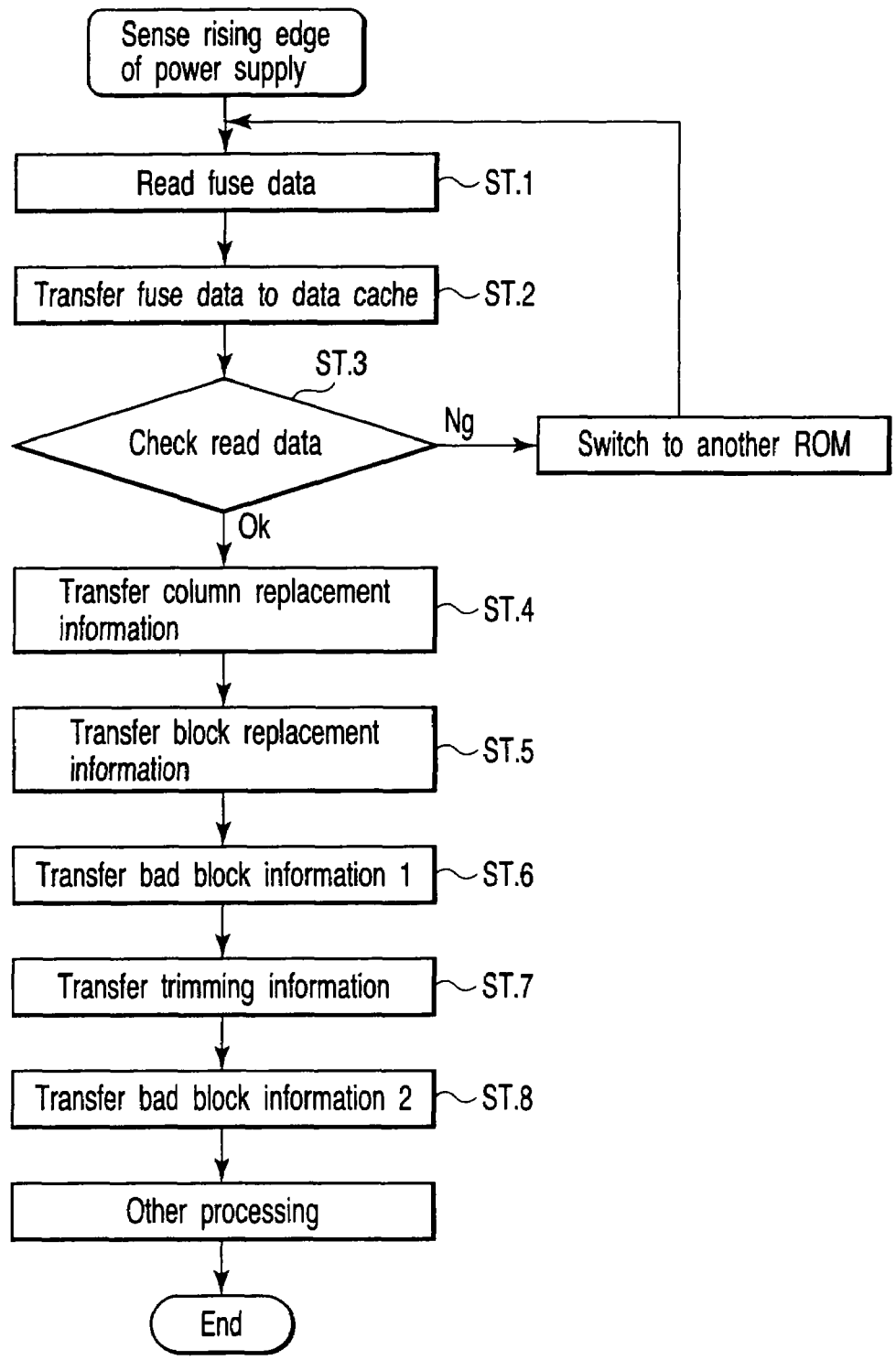
FIG. 4 is a flowchart showing one example of a flow of the boot sequence of the semiconductor integrated circuit device according to the first embodiment of the present invention.

FIG. 4 is a flowchart showing one example of a flow of a boot sequence of the semiconductor integrated circuit device according to the first embodiment of the present invention.

As shown in FIG. 4, when the power supply detecting circuit 100 detects a rising edge of a power supply, the fuse data is read out of the internal ROM 102 (ST. 1).

Next, the read fuse data is transferred to the data cache 103 (ST. 2). The transferred fuse data is retained in the data cache 103.

Next, after the fuse data is retained in the data cache 103, and before the fuse data is transferred to the register groups 104-1 to 104-m, the read fuse data is checked (ST. 3). With respect to the checking of the fuse data, for example, it is recommended that a data judging pattern of several bytes be stored in advance in an area which is a part of the fuse data, and the data judging pattern be read out, it be judged whether or not the read data judging pattern is a pattern as expected.

When the read data judging pattern is not as expected, the ROM is switched to another ROM, and ST. 1 to ST. 3 are again executed. Another ROM in the present example is spare fuse data. The spare fuse data is stored at a storage destination different from that of the original fuse data, in the internal ROM 102. At the time of rereading from another ROM, a circuit which switches addresses of access destinations between initial reading and rereading is provided in advance, and it suffices to switch the addresses by utilizing the circuit. Note that the spare fuse data may be stored in an internal ROM provided separately from the internal ROM 102.

When the read data judging pattern is as expected (OK), the fuse data retained in the data cache 103 is transferred to the register groups 104-1 to 104-m, for example, in units of one byte or two bytes. In the present example, first, the column replacement information included in the fuse data is transferred to the register group 104-1 (ST. 4). The transferred column replacement information is stored in a corresponding register among a plurality of registers included in the register group 104-1.

Next, the block replacement information included in the fuse data is transferred to the register group 104-2 (ST. 5). The transferred block replacement information is stored in a corresponding register among a plurality of registers included in the register group 104-2.

Figure 5:
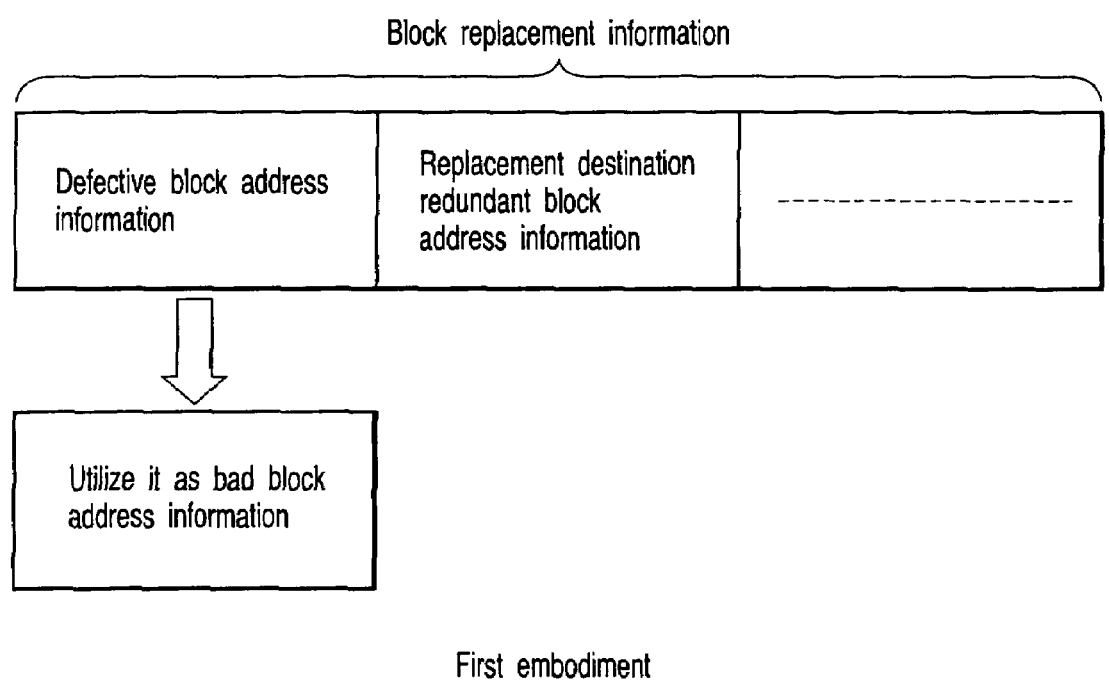
FIG. 5 is a diagram showing one example of information elements of block replacement information.

Next, the bad block information 1 included in the fuse data is transferred to the register group 104-4 (ST. 6). Here, in the present example, the following devisal is achieved. Namely, the block replacement information is utilized as a source of the bad block information 1. To divide the block replacement information into information elements, there are included two information elements. One example of information elements of the block replacement information is shown in FIG. 5. One example shown in FIG. 5 is, for example, a case in which a flexible mapping redundancy technique is applied to the present invention. In the flexible mapping redundancy technique, a redundancy judgment circuit and a redundant circuit are not made to correspond to one another, and those are made to correspond randomly. It goes without saying that the present embodiment is not limited to the flexible mapping redundancy technique, and a redundancy technique in which a redundancy judgment circuit and a redundant circuit are made to correspond to one another can be applied to the present invention. When the flexible mapping redundancy technique is applied to the present embodiment, the block replacement information includes address information of a defective block as a first information element, and address information of a redundant block serving as a replacement destination as a second information element. In the present example, the first information element among these two information elements, i.e., the address information of the defective block is utilized, and this is regarded as the bad block information 1. Because the first embodiment is of a type in which defective blocks are registered as bad blocks, an address of a defective block can be used as an address of a bad block as it is. The address information of the defective block, i.e., the bad block information 1 is stored in a corresponding register among a plurality of registers included in the register group 104-4.

Next, the trimming information included in the fuse data is transferred to the register group 104-3 (ST. 7). The transferred trimming information is stored in a corresponding register among a plurality of registers included in the register group 104-3.

Next, the bad block information 2 included in the fuse data is transferred to the register group 104-4 (ST. 8). The bad block information 2 is registered, for example, if there is a defective block which cannot be replaced by a redundant block. There are cases in which the bad block information 2 is registered and is not registered before shipping. When there is the bad block information 2, it is stored in a corresponding register among the plurality of registers included in the register group 104-4.

Thereafter, when there is other processing, the boot sequence is completed by carrying out the other processing.

Figure 6:
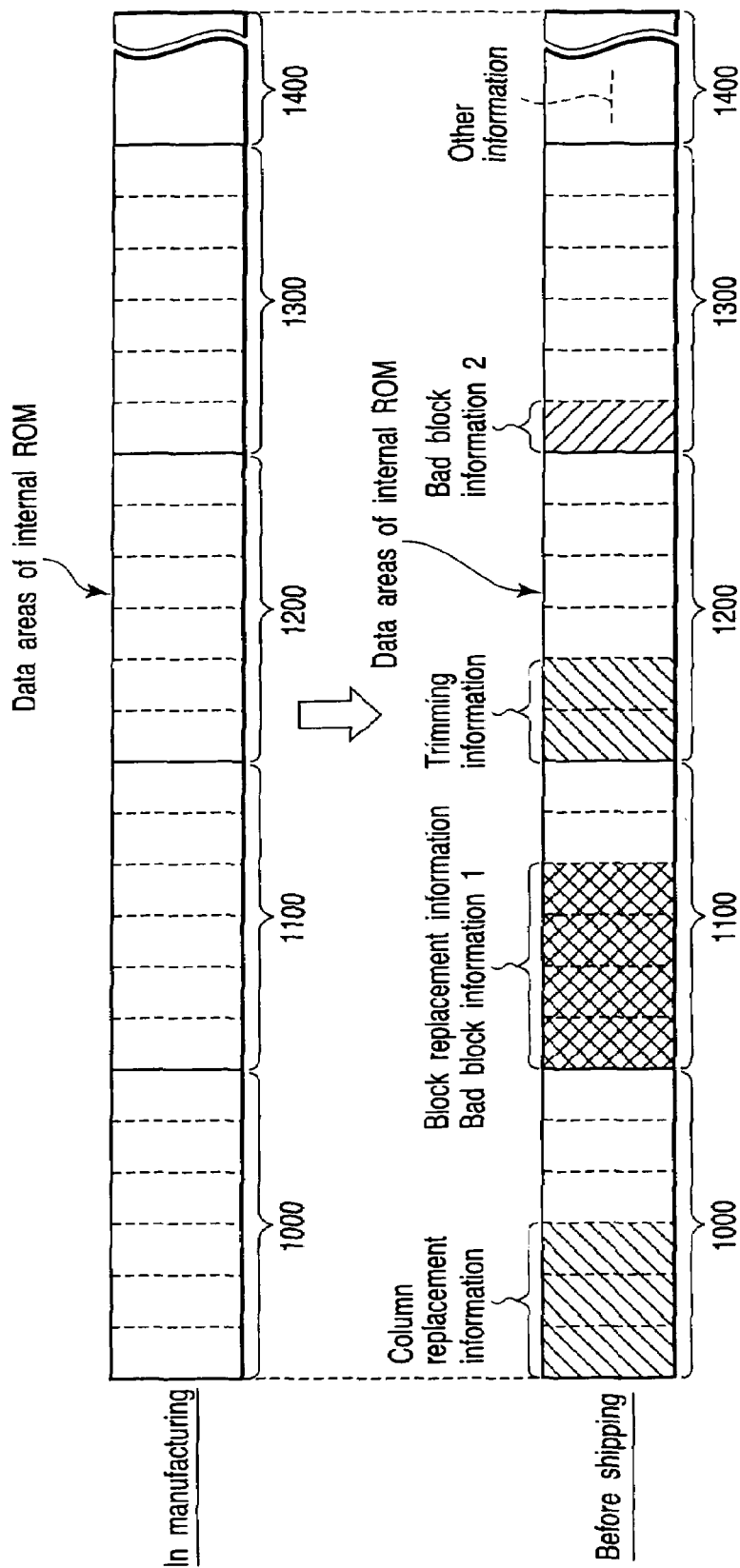
FIG. 6 is a diagram showing assignment of data areas in an internal ROM and a state of registration of data in the semiconductor integrated circuit device according to the first embodiment of the present invention.

Assignment of data areas in the internal ROM and a state of registration of data in the semiconductor integrated circuit device according to the first embodiment are shown in FIG. 6.

Figure 7:
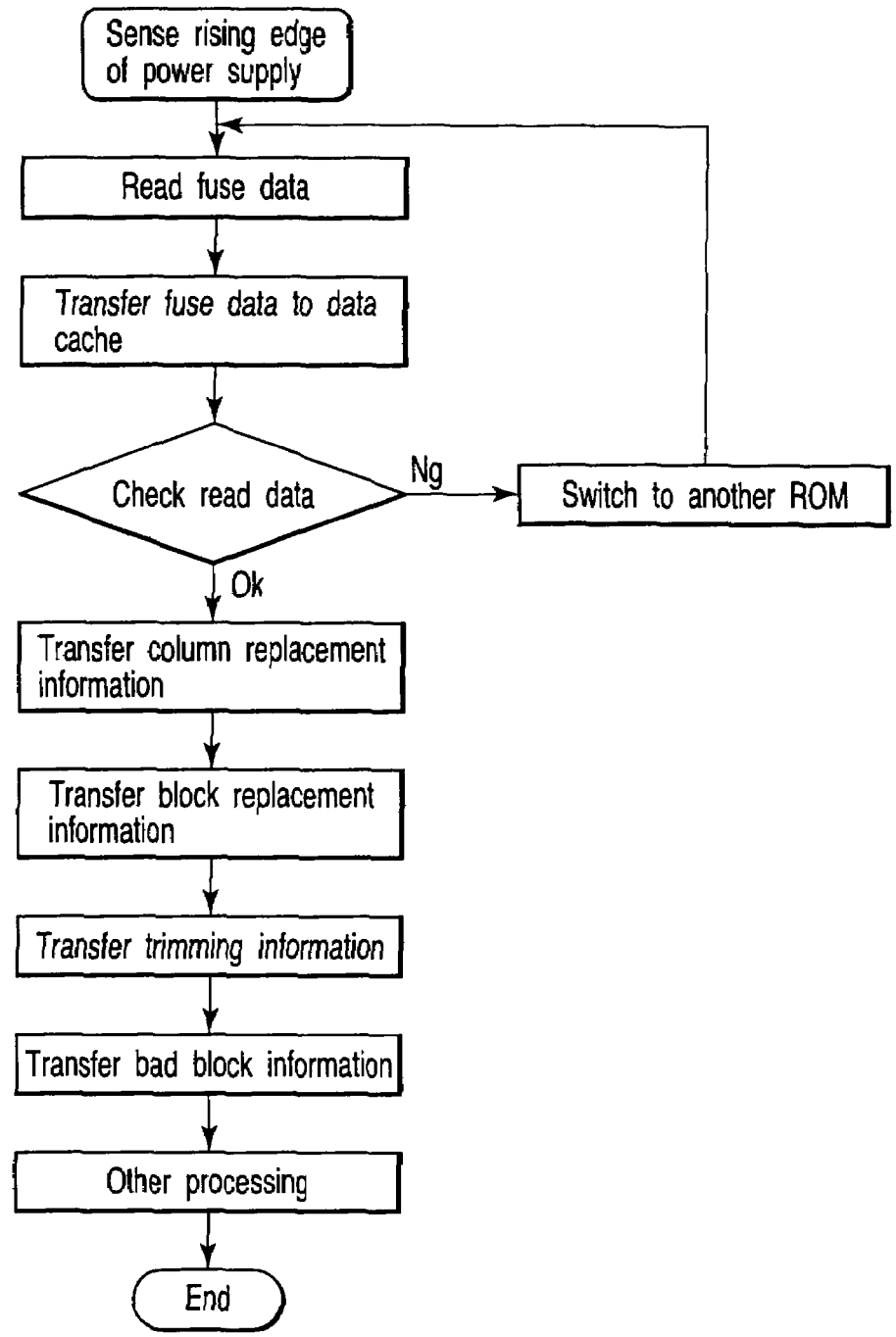
FIG. 7 is a flowchart showing a flow of a boot sequence in the reference examples 1 and 2.

Further, as a reference of a flow of a boot sequence, a flow of the boot sequence in the reference examples 1 and 2 is shown in FIG. 7.

As shown in FIG. 7, in the boot sequence shown in the reference examples 1 and 2, there is no procedure corresponding to the transfer of the bad block information 1 shown in FIG. 4. The transfer of the bad block information shown in FIG. 7 corresponds to the transfer of the bad block information 2 shown in FIG. 4.

In accordance with the first embodiment, the block replacement information is utilized as a source of the bad block information 1 when a defective block is handled as a bad block. In the present example, among the information elements included in the block replacement information, the address information of the defective block is utilized as the bad block information 1. Therefore, in a nonvolatile semiconductor memory of a type in which a defective block is registered as a bad block, there is no duplicate information to be registered in the internal ROM. Accordingly, it is possible to register only blocks bringing about a defect, except for defective blocks, with the bad block registration area. Accordingly, for example, when it is possible to register 40 blocks with the bad block registration area, all the blocks can be used.

In this way, in accordance with the first embodiment, it is possible to provide a semiconductor integrated circuit device having a nonvolatile semiconductor memory which can efficiently use an internal ROM in which information utilized during a boot sequence is stored.

Moreover, because a defective block is handled as a bad block, an electric potential of the word line is forcibly controlled so as not to apply a voltage to a word line at all even with respect to the defective block. Therefore, even at the time of batch erasing of the chip, a short-circuit current or the like can be prevented from being brought about at the defective block, and it is possible to reduce the possibility that a power supply capacity is deteriorated, or the chip is broken. Accordingly, it is possible to obtain a highly-reliable nonvolatile semiconductor memory.

SECOND EMBODIMENT

Next, a concrete example of a semiconductor integrated circuit device in which it is possible to execute the example of the boot sequence described in the first embodiment will be described as a second embodiment.

Figure 8:
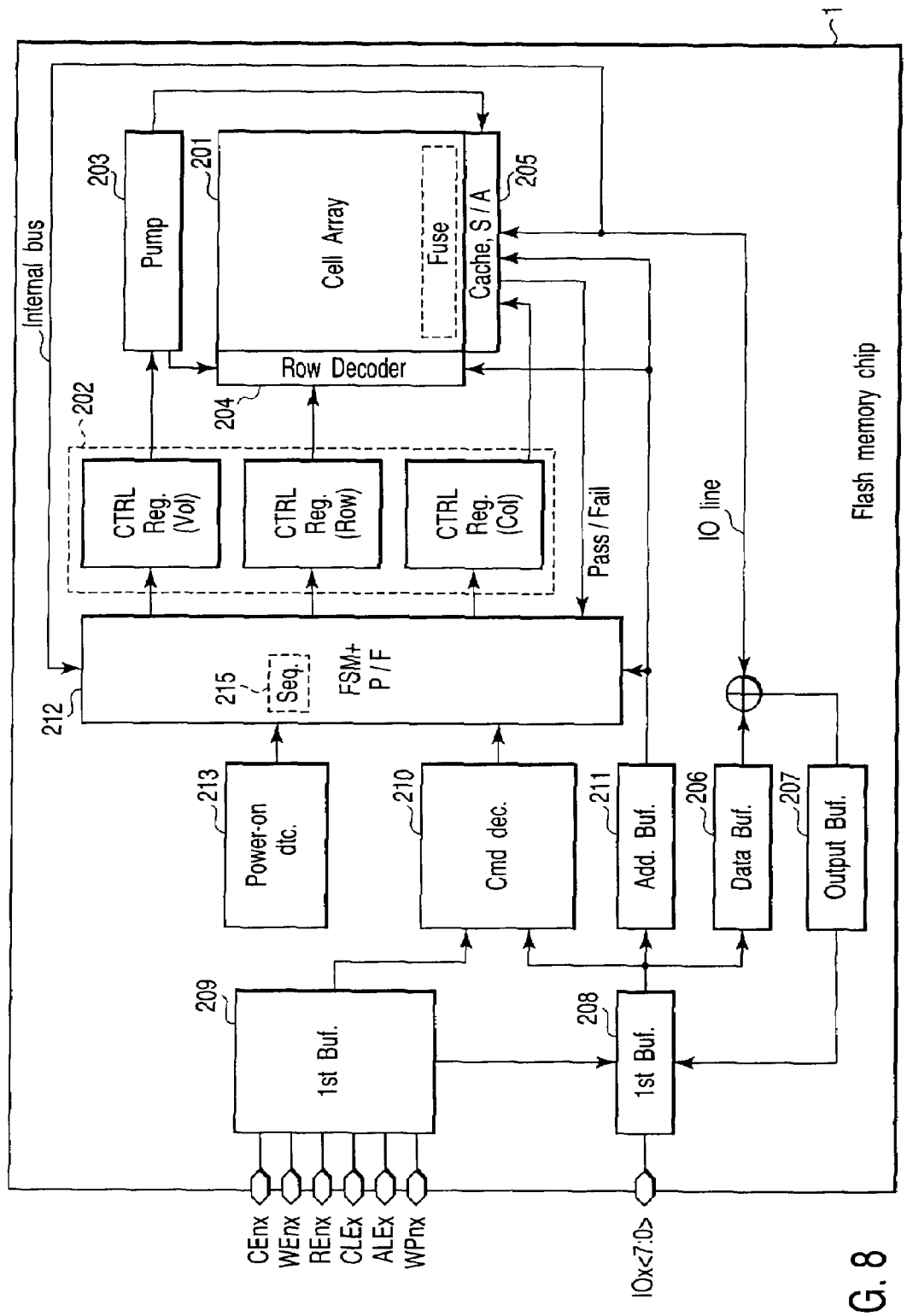
FIG. 8 is a block diagram showing one example of a semiconductor integrated circuit device according to a second embodiment of the present invention.

FIG. 8 is a block diagram showing one example of the semiconductor integrated circuit device according to the second embodiment of the present invention. In the present example, a NAND type flash memory is shown as the semiconductor integrated circuit device.

(Memory Cell Array: 201)

As shown in FIG. 8, the semiconductor integrated circuit device has a memory cell array 201. The memory cell array 201 is a portion of a main memory of a NAND type flash memory. In the memory cell array 201, nonvolatile semiconductor memory cells are disposed in a matrix form. One example of a nonvolatile semiconductor memory cell is a flash memory cell. A concrete example of the memory cell array 201 is shown in FIG. 9.

Figure 9:
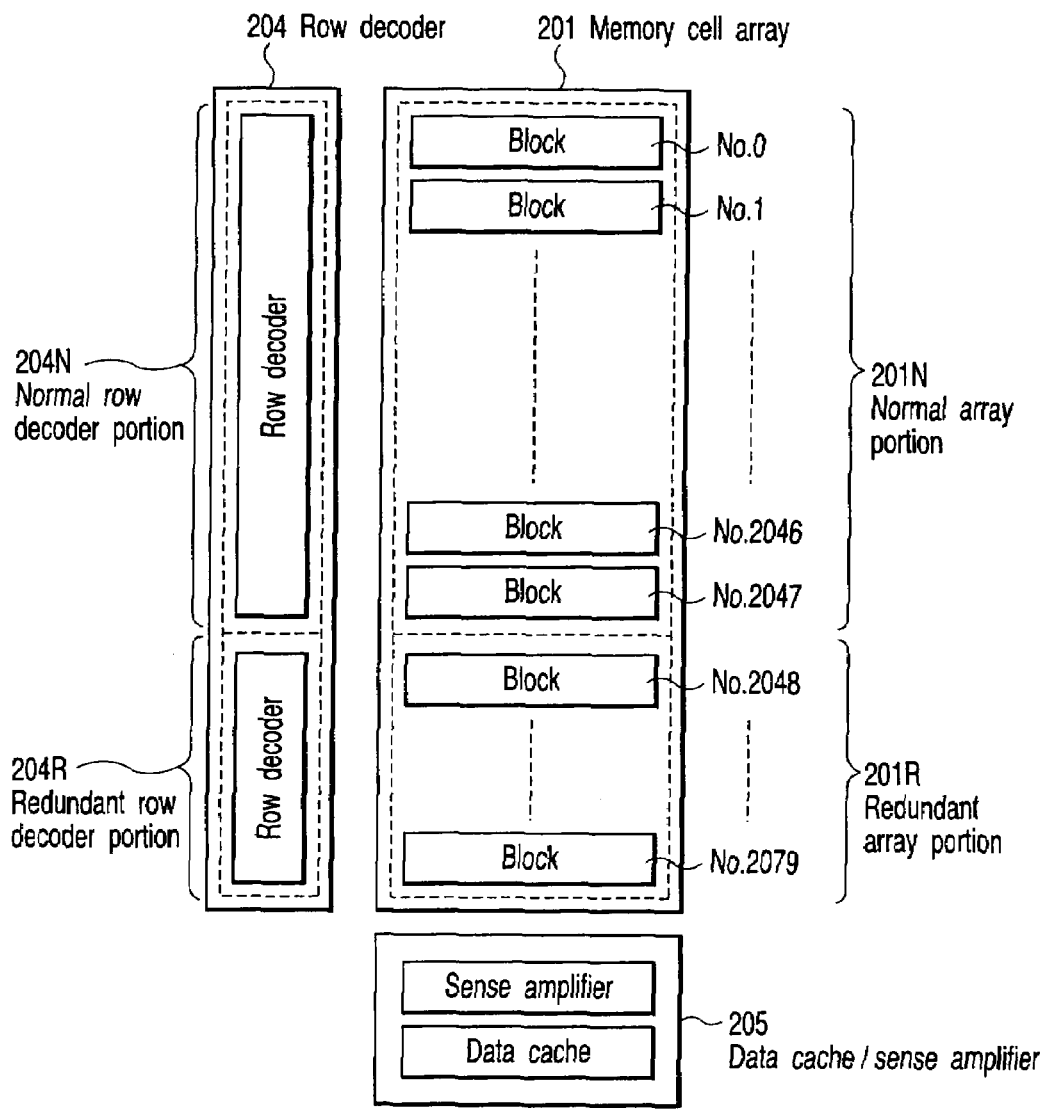
FIG. 9 is a block diagram showing one example of a memory cell array.

As shown in FIG. 9, the memory cell array 201 includes a plurality of blocks, which are 2080 blocks in the present example (No. 0 to No. 2079). A block is a minimum unit of erasing data. One example of a block is shown in FIG. 10.

Figure 10:
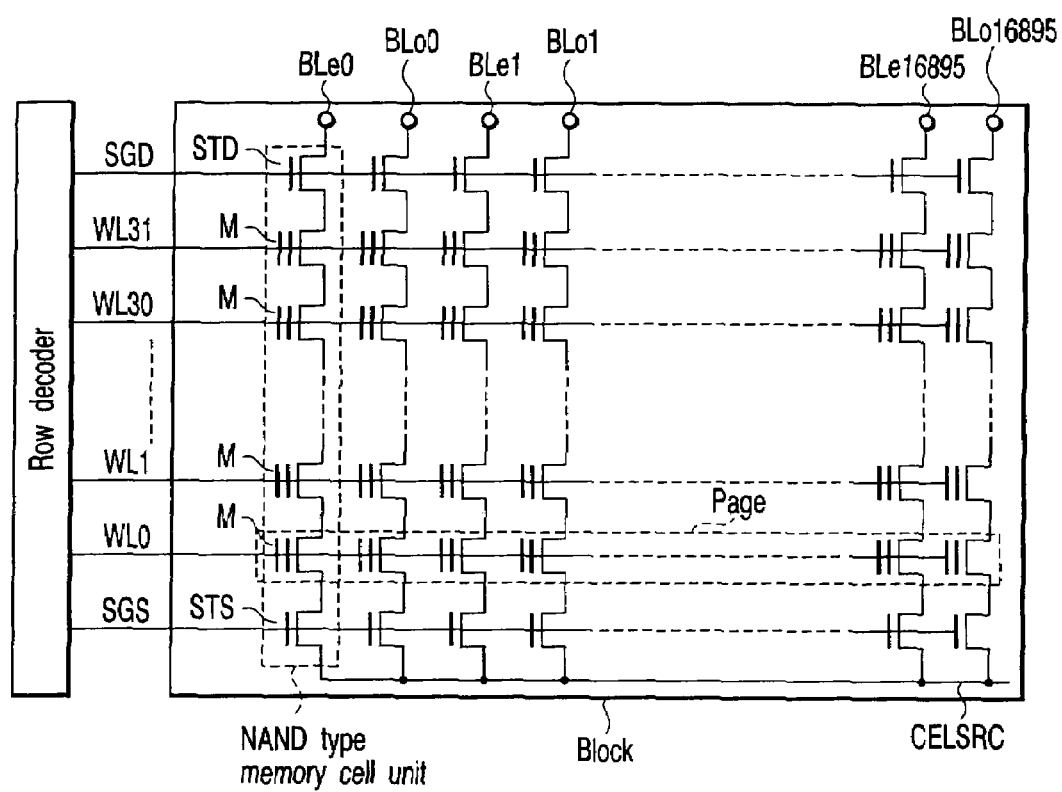
FIG. 10 is a circuit diagram showing one example of a block.

As shown in FIG. 10, a block includes a plurality of NAND type memory units, which are 33792 NAND type memory units in the present example. The NAND type memory unit in the present example includes two select transistors STD and STS, and a plurality of memory cells M (which is 32 in the present example) which are connected in series therebetween. One end of the NAND type memory unit is connected to a bit line BL via the select transistor STD connected to a select gate line SGD, and the other end thereof is connected to a shared source line CELSRC via the select transistor STS connected to a select gate line SGS. A plurality of memory cells M are connected to word lines WL. With respect to a bit line BLe which is an even number line counted from 0, and a bit line BLo which is an odd number line, writing and reading of data are carried out independently of one another. For example, writing and reading of data are carried out simultaneously with respect to, for example, 16896 memory cells M connected to the bit line BLe among 33792 memory cells connected to a word line WL.

When one memory cell M stores 1-bit data, data of 16896 memory cells M connected to the bit line BLe gather together to structure a unit of page. A page is a minimum unit for reading and writing, and for example, given that the number of I/O pins is "8", the page is expressed by 2112 bytes. In the same way, 16896 memory cells M connected to the bit line BLo structure another page. Writing and reading of data are carried out for each page. One page can be divided into several segments. In the present example, one page of 2112 bytes is divided into a data area (512 bytes×4=2048 bytes), a redundant column area (10 bytes×4=40 bytes), and a management data area (24 bytes×1=24 bytes).

Further, when one memory cell M stores 2-bit data, 16896 memory cells M connected to the bit line BLe store data of two pages. In the same way, 16896 memory cells M connected to the bit line BLo structure other two pages. In this case as well, writing and reading of data are carried out for each page.

Moreover, as shown in FIG. 9, the memory cell array 201 in the present example includes a normal array portion 201N, and a redundant array portion 201R. The normal array portion 201N includes blocks (normal blocks) which are not used as redundant blocks. The normal blocks in the present example are No. 0 to No. 2047. The redundant array portion 201R includes blocks which are used or usable as redundant blocks. The blocks which are used or usable as redundant blocks in the present example are No. 2048 to No. 2079. Hereinafter, the blocks of No. 2048 to No. 2079 are called redundant blocks.

The row decoder 204 in the present example includes a normal decoder portion 204N and a redundant decoder portion 204R. The normal decoder portion 204N selects the normal blocks No. 0 to No. 2047, and the word lines WL and block select gate lines in the normal blocks No. 0 to No. 2047. The redundant decoder portion 204R selects the redundant blocks No. 2048 to No. 2079, and the word lines WL and block select gate lines in the redundant blocks No. 2048 to No. 2079.

(Control Circuit: 202)

A control circuit (CTRL) 202 includes a voltage control circuit (Vol), a row control circuit (Row), and a column control circuit (Col).

The voltage control circuit (Vol) controls a power supply circuit (Pump) 203. The power supply circuit (Pump) 203 includes a booster circuit, for example, a charge pump circuit, and generates voltages required for erasing, writing, and reading of data.

The row control circuit (Row) controls a row decoder 204. The row decoder 204 selects the word lines and the block select gate lines of the memory cell array 201, and applies voltages required for erasing, writing, and reading of data to the selected word lines and block select gate lines.

The column control circuit (Col) controls a data cache/sense amplifier (Cache, S/A) 205, and controls the bit lines of the memory cell array 201, and carries out erasing of data from the memory cells, writing of data into the memory cells, and reading of data from the memory cells.

(Data Buffer: 206/Output Buffer: 207)

A data buffer (Data Buf.) 206 and an output buffer (Output Buf.) 207 are electrically connected to the data cache/sense amplifier 205 via an IO line.

(First Buffers: 208, 209)

A first buffer (1st Buf.) 208 carries out receiving of command data, address data, and writing data from an external IO line (IOx <7:0>). The first buffer 208 is electrically connected to the data buffer 206, the output buffer 207, a command decoder 210, and an address buffer 211. The external IO line (IOx <7:0>) is electrically connected to an external host (not shown).

A first buffer 209 carries out receiving of control signals (CEnx, WEnx, REnx, CLEx, ALEx, WPnx). The first buffer 209 is electrically connected to the first buffer 208 and the command decoder 210.

The control signals (CEnx, WEnx, REnx, CLEx, ALEx, WPnx) are transmitted from the first buffer 209 to the first buffer 208 and the command decoder 210. On the basis of the control signals (CEnx, WEnx, REnx, CLEx, ALEx, WPnx) from the first buffer 209, when the data received via the external IO line (IOx <7:0>) is command data, the first buffer 208 transmits it to the command decoder 210, and when the received data is address data, the first buffer 208 transmits it to the address buffer 211, and when the received data is writing data, the first buffer 208 transmits it to the data buffer 206.

(Command Decoder: 210)

When the data received by the first buffer 208 is command data, the command decoder 210 transmits the data as command data to a flash state machine+peripheral circuits (FSM+P/F) 212.

(Flash State Machine+Peripheral Circuits: 212)

The flash state machine+peripheral circuits 212 carry out management of the entire flash memory. The flash state machine+peripheral circuits 212 receive command data, and carry out management of erasing of data, writing of data, reading of data, and input/output of data. Therefore, the flash state machine+peripheral circuits 212 control, for example, the control circuit (CTRL) 202.

(Power-on Detection Circuit: 213)

A power-on detection circuit 213 is a circuit detecting that a power supply is applied, and corresponds to the power-on detecting circuit 100 shown in FIG. 3. For example, a power-on reset circuit is utilized as the power-on detecting circuit 213. The flash state machine+peripheral circuits 212 include a sequencer (Seq.) 215 controlling the boot sequence during a boot sequence. The sequencer 215 corresponds to the sequencer 101 shown in FIG. 3.

(Internal ROM: Fuse)

An internal ROM (Fuse) is a memory with which information utilized for a boot sequence is registered, and corresponds to the internal ROM 102 shown in FIG. 3. As the internal ROM (Fuse) in the present example, the memory cell array 201 is used. Further, as the data cache 103 shown in FIG. 3, a data cache included in the data cache sense/amplifier (Cache, S/A) 205 is used.

It goes without saying that the memory cell array 201 is not used as the internal ROM (Fuse), and it may be provided to another portion. Further, as the data cache as well, the data cache included in the data cache sense/amplifier (Cache, S/A) 205 is not used, and it may be provided to another portion.

Next, operations of the NAND type flash memory according to the second embodiment will be described along with a concrete example of the circuit. Erasing of data, writing of data, and reading of data in the present example may be the same as operations of a well-known NAND type flash memory. Therefore, hereinafter, only operations in a boot sequence will be described. The boot sequence of the NAND type flash memory according to the present example follows the flow of the boot sequence shown in FIG. 4.

After the power supply detecting circuit 213 detects that a power supply supplied from the outside reaches a predetermined level, the sequencer 215 starts boot sequence. One example of the circuit of the sequencer 215 is shown in FIG. 11, and one example of operations of the sequencer 215 is shown in FIG. 12.

Figure 11:
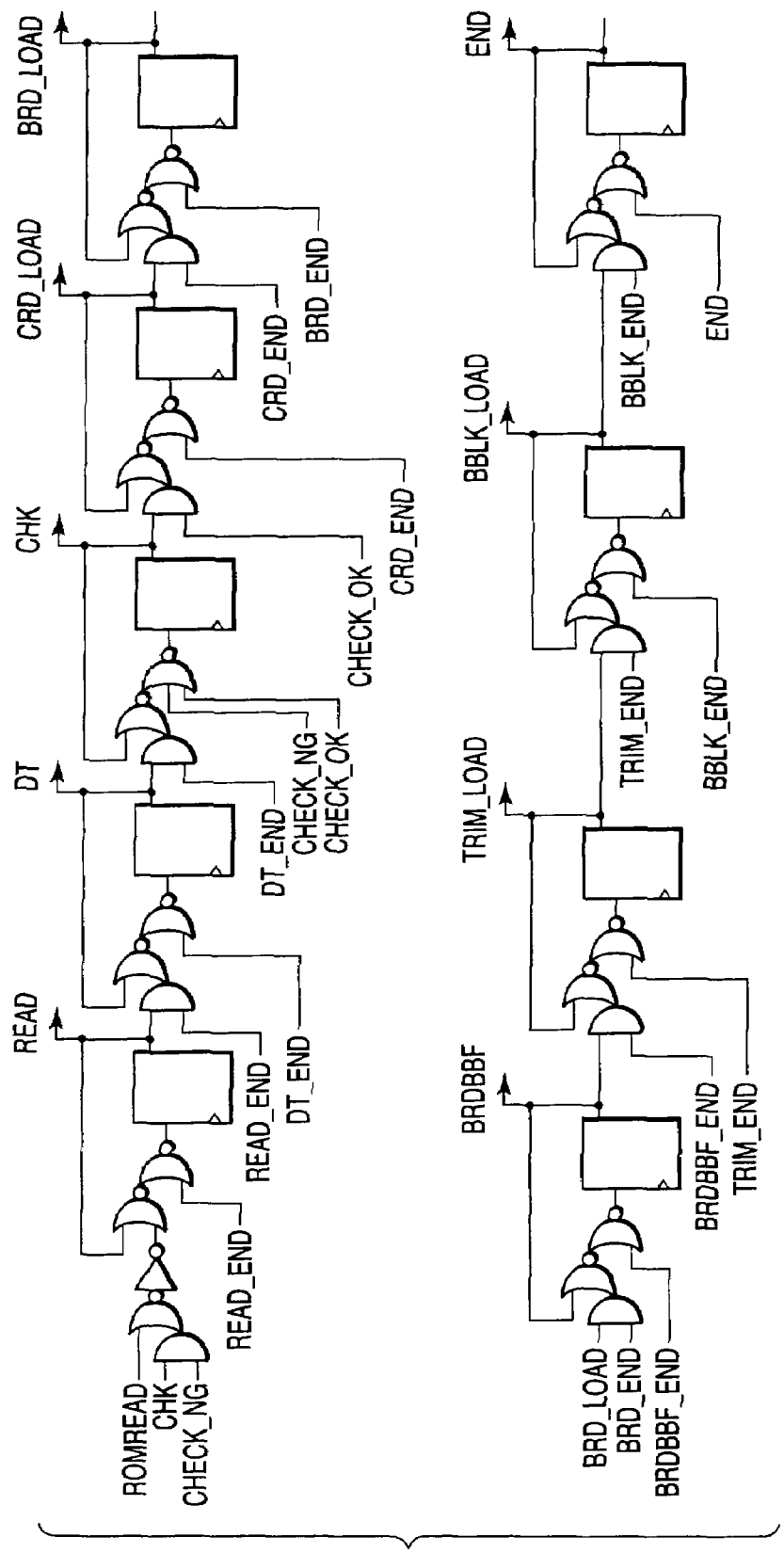
FIG. 11 is a circuit diagram showing one example of a circuit of a sequencer.
Figure 12:
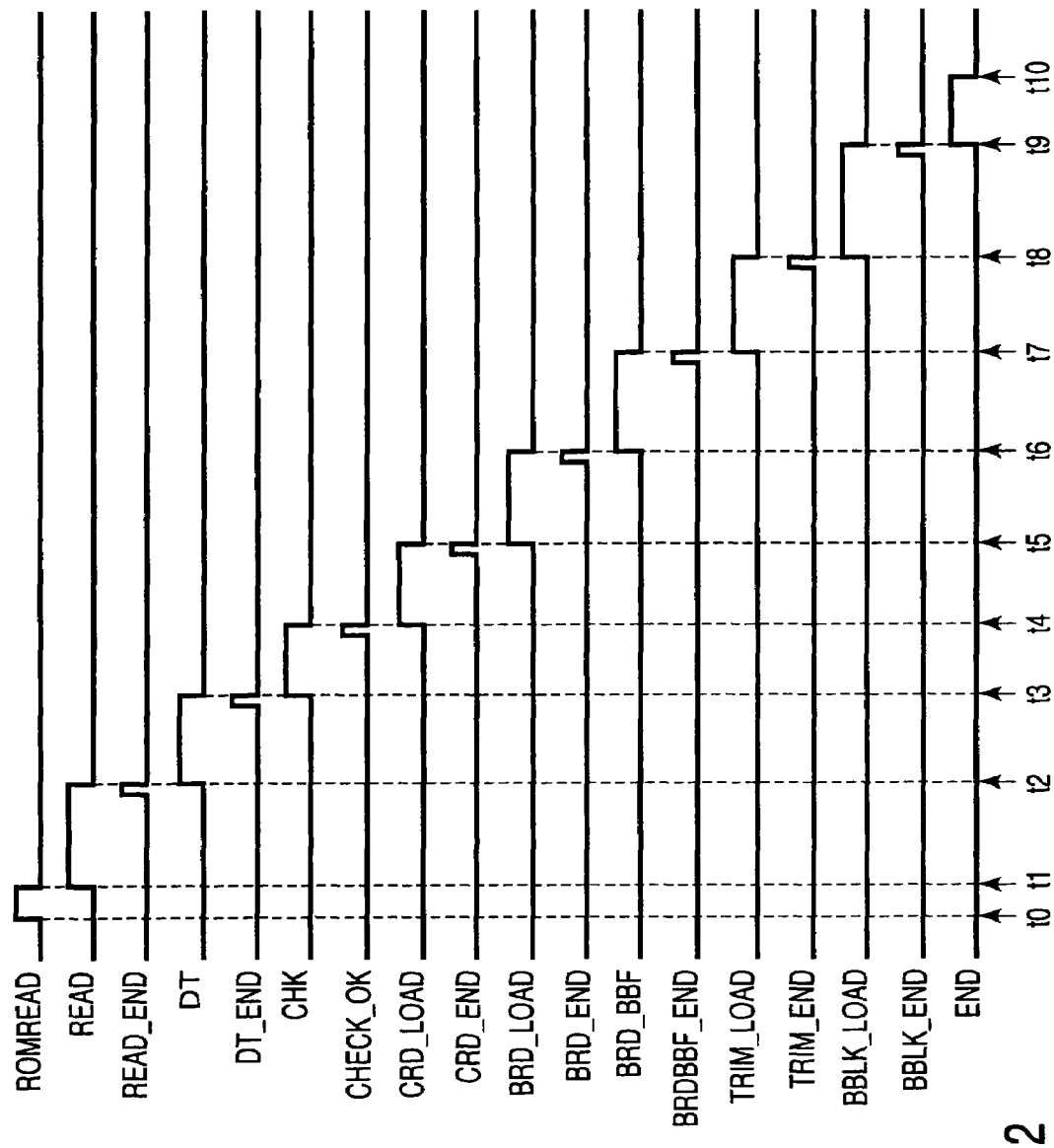
FIG. 12 is an operating waveform chart showing one example of operations of the sequencer shown in FIG. 11.

As shown in FIGS. 11 and 12, before the power supply reaches a predetermined level, all the input signals to the sequencer 215 are at "Low" levels. After the power supply detecting circuit 213 detects that the power supply reaches the predetermined level, a signal ROMREAD is temporarily raised to a "High" level (t0). The signal ROMREAD is outputted from, for example, the power supply detecting circuit 213.

When the signal ROMREAD returns to a "Low" level from the "High" level, the sequencer 215 raises a fuse data read signal READ to a "High" level. When the signal READ is raised to a "High" level, reading of the fuse data is started (time t1).

When reading of the fuse data is completed, a signal READ_END is raised to a "High" level. Both of the signal READ and the signal READ_END return to "Low" levels, the sequencer 215 raises a data cache transfer signal DT to a "High" level. When the signal DT is raised to a "High" level, transfer of the fuse data to the data cache is started, and the fuse data is retained in the data cache (time t2).

When the transfer and retention of the fuse data are completed, a signal DT_END is raised to a "High" level. Thereafter, both of the signal DT and the signal DT_END return to "Low" levels, the sequencer 215 raises a data check signal CHK to a "High" level. When the signal CHK is raised to a "High" level, checking of the fuse data retained in the data cache is started (time t3).

Although not shown in FIG. 12, when a checked result is "NG", a signal CHECK_NG is raised to a "High" level. When both of the signal CHK and the signal CHECK_NG are raised to "High" levels, the sequencer 215 again raises the fuse data read signal READ to a "High" level. Then, rereading of the fuse data is executed. Hereinafter, transfer and retention of the fuse data, and a checking operation of the fuse data are sequentially executed.

Figure 13:
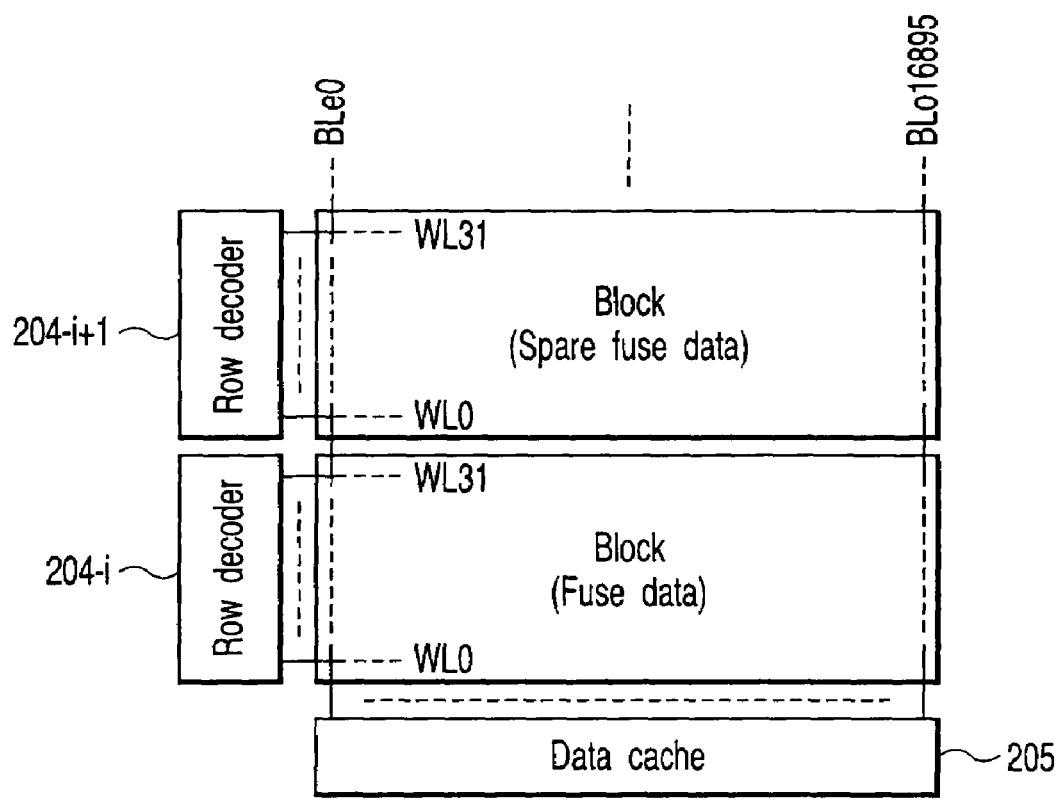
FIG. 13 is a block diagram showing one example of switching of an access destination.

Note that the rereading is executed, for example, by switching to another ROM as described with reference to FIG. 4. At the time of rereading from another ROM, a circuit switching addresses of access destinations between the initial reading and the rereading is provided in advance, and it suffices to switch the addresses by utilizing this circuit. A concrete example thereof is shown in FIG. 13. The example shown in FIG. 13 is an example in which row addresses are switched. In FIG. 13, two blocks are shown. In the present example, the fuse data is registered with one block, and the same fuse data is registered as a backup with the other block. In the initial reading, for example, one block is selected by using a row decoder 204-i, and the fuse data is retained in the data cache 205. In the rereading, for example, the other block is selected by using a row decoder 204-i+1, and the spare fuse data is retained in the data cache 205.

In this way, by registering the spare fuse data in the other block, even when a defect is brought about in one block, it is possible to use the chip continuously by accessing to the other block. This contributes to extension of a lifetime of a product.

Note that the switching of addresses of access destinations which is executed when a checked result is "NG" is not limited to the example shown in FIG. 13.

When a checked result is "OK", a signal CHECK-OK is raised to a "High" level. Thereafter, when both of the signal CHK and the signal CHECK-OK return to "Low" levels, the sequencer 215 raises a column redundancy information read signal CRD_LOAD to a "High" level. When the signal CRD_LOAD is raised to a "High" level, transfer of the column redundancy information among the fuse data retained in the data cache to a register group for storing column redundancy information is started, and the column redundancy information is stored in this register group (time t4). The register group for storing column redundancy information (Reg.) is disposed in, for example, the column control circuit (Col) of the control circuit 202.

When the transfer and storage of the column redundancy information are completed, a signal CRD_END is raised to a "High" level. Thereafter, both of the signal CRD_LOAD and the signal CRD_END return to "Low" levels, the sequencer 215 raises a block redundancy information read signal BRD_LOAD to a "High" level. When the BRD_LOAD is raised to a "High" level, transfer of block redundancy information among the fuse data retained in the data cache to a register group for storing block redundancy information is started, and the block redundancy information is stored in this register group (time t5).

Note that the register group for storing block redundancy information (Reg.) is disposed in an address system circuit, for example, the row control circuit (Row) of the control circuit 202. One example of the register group for storing block redundancy information is shown in FIG. 14.

Figure 14:
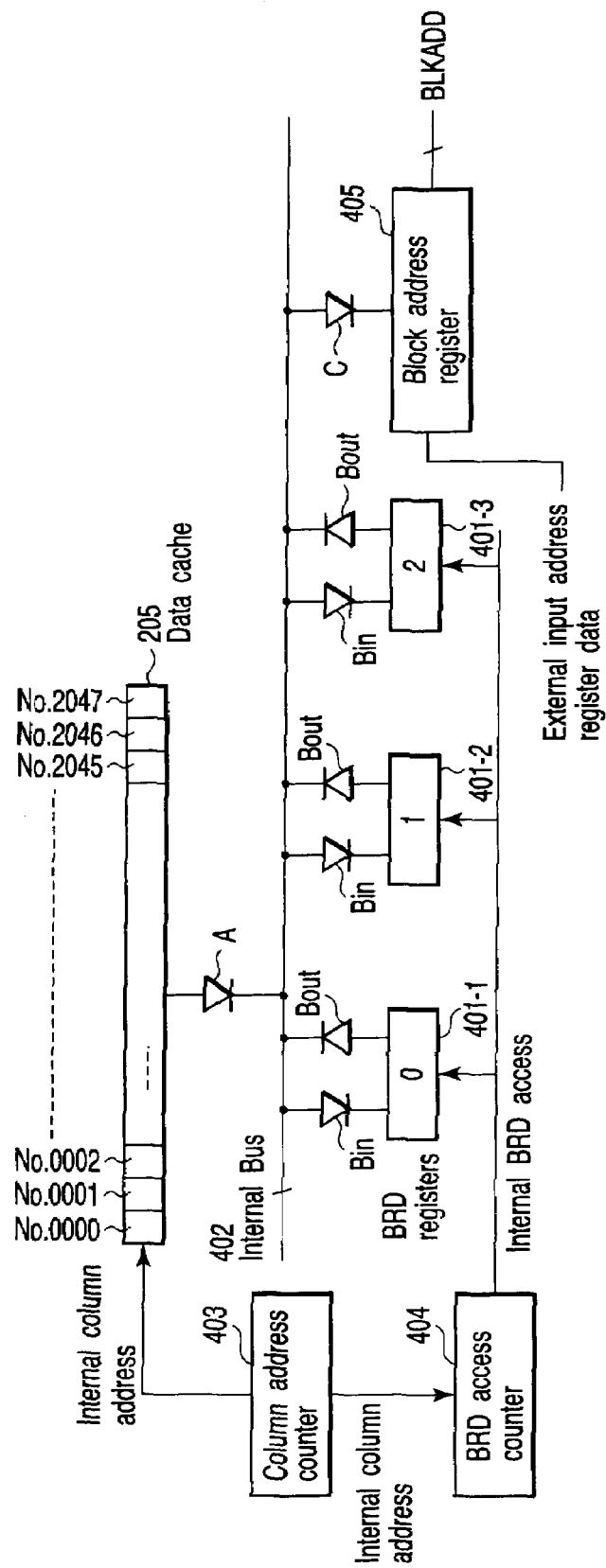
FIG. 14 is a circuit diagram showing one example of a circuit of a register group for storing block redundancy information.

As shown in FIG. 14, the register group for storing block redundancy information includes a plurality of block redundancy registers (hereinafter BRD registers) 401. In the present example, three BRD registers 401-1 to 401-3 are included. Note that the number of BRD registers is not limited to three. To describe concretely, because the NAND type flash memory according to the present example has 32 redundant blocks as shown in FIG. 9, 32 BRD registers 401 at a maximum are provided. The BRD registers 401-1 to 401-3 correspond to the register group 104-2 shown in FIG. 3. The BRD registers 401-1 to 401-3 respectively have storage capacities of, for example, about 1 byte to 2 bytes. The BRD registers 401-1 to 401-3 in the present example store address information of defective blocks among the block redundancy information.

The data cache 205 is connected to an internal bus 402 via a gate A. The internal bus 402 is connected to the inputs of the BRD registers 401-1 to 401-3 via gates Bin. The outputs of the BRD registers 401-1 to 401-3 are connected to the internal bus 402 via gates Bout. The data cache 205 includes latching circuit groups No. 0000 to No. 2047 as shown in FIG. 14. The latching circuit groups No. 0000 to No. 2047 have storage capacities of, for example, 1 byte, and include, for example, 8 latching circuits.

A column address counter 403 sequentially increments or decrements a value of a counter, and outputs an internal column address. The internal column address is inputted to the data cache 205. The 2048 latching circuit groups No. 0000 to No. 2047 included in the data cache 205 are selected on the basis of the internal column address.

When a unit of data transfer is 1 byte, the internal column address selects, for example, one latching circuit group at a time from the latching circuit groups No. 0000 to No. 2047. A latching circuit group to be selected is changed every time a value of the internal column address is changed by incrementing or decrementing a value of the column address counter 403. In accordance therewith, every time the internal column address is changed, one byte data from different data latching circuit groups are sequentially outputted to the internal bus 402.

When a unit of data transfer is plural bytes, the internal column address selects, for example, a plurality of latching circuit groups at a time from the latching circuit groups No. 0000 to No. 2047. For example, when a unit of data transfer is 2 bytes, two latching circuit groups are selected at a time. In this case as well, a plurality of latching circuit groups to be selected are changed every time a value of the internal column address is changed by incrementing or decrementing a value of the column address counter 403. In accordance therewith, every time the internal column address is changed, plural-byte data are sequentially outputted from different latching circuit groups to the internal bus 402.

Note that the data may be transferred in a time-shared manner. For example, when a bus width of the internal bus 402 is 1 byte, and a storage capacity for each of the BRD registers 401-1 to 401-3 is two bytes, the data may be transferred by 1 byte in twice with respect to one BRD register 401. Further, the data may be transferred in parallel. For example, when a bus width of the internal bus 402 is 2 bytes, and a storage capacity for each of the BRD registers 401-1 to 401-3 is 1 byte, the data may be transferred by 1 byte simultaneously with respect to two BRD registers 401.

When the data is transferred from the data cache 205 to the internal bus 402, a gate signal given to the gate of the gate A is activated, for example, raised to a "High" level. In accordance therewith, transfer of the data from the data cache 205 to the internal bus 402 is permitted. Then, a gate signal provided to the gate of the gate Bin is activated, for example, raised to a "High" level. In accordance therewith, transfer of the data from the internal bus 402 to the BRD registers 401 (401-1 to 401-3) is permitted.

The internal column address outputted from the column address counter 403 is inputted to a BRD access counter 404. The BRD access counter 404 increments or decrements a value of the counter in accordance with a change of the internal column address, and outputs an internal BRD access. The internal BRD access is inputted to the BRD resisters 401. There are a plurality, which is three (401-1 to 401-3) in the present example, of BRD resisters 401. For example, one of the three is selected by the internal BRD access. A BRD resister 401 to be selected is changed every time a value of the internal BRD access is changed by incrementing or decrementing a value of the BRD access counter 404. The selected BRD register 401 is permitted to carry out the operation of storing data.

In this way, the BRD access counter 404 increments or decrements a value of the counter in accordance with a change of the internal column address, an input of an increment signal, or an input of a decrement signal, and outputs an internal BRD access. In accordance therewith, it is possible to determine always uniquely in which BRD register the data in a data cache 205 (a latching circuit group) is stored. One example of such operations is shown in FIG. 15.

Figure 15:
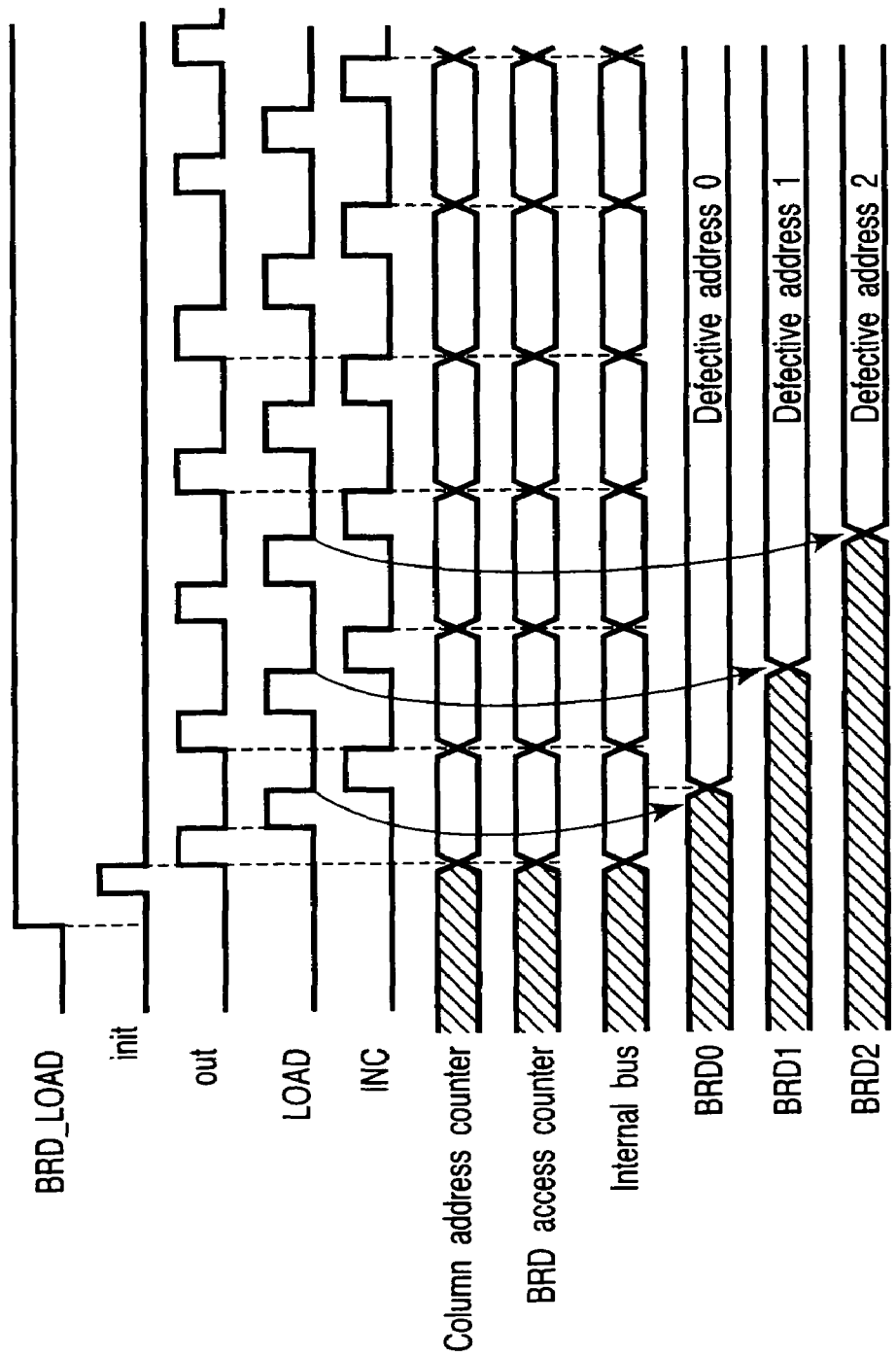
FIG. 15 is a signal waveform diagram showing one example of operations for storing data stored in a data cache into a BRD register.

As shown in FIG. 15, after the signal BRD_LOAD is raised to a "High" level, a signal init is raised to a "High" level. The signal init is a signal for initializing a value of the column address counter 403. When the signal init is raised to a "High" level, a value of the column address counter 403 is made to be an initial value, and when the signal init returns to a "Low" level, the internal column address is outputted from the column address counter 403. In accordance therewith, a value of the BRD access counter 404 is made to be an initial value.

A signal out is a signal for transferring the data of the latching circuit group selected by the column address counter 403 to the internal bus 402. The signal out corresponds to the gate signal given to the gate A shown in FIG. 14. When the signal out is raised to a "High" level, the data is transferred to the internal bus 402. When the signal out returns to a "Low" level, a signal LOAD is raised to a "High" level. The signal LOAD is a signal for transferring the data transferred to the internal bus 402, to the BRD registers 401. The signal LOAD corresponds to the gate signal given to the gate Bin shown in FIG. 14. When the signal LOAD is raised to a "High" level, the data transferred to the internal bus 402 is transferred to the BRD register selected by the BRD access counter 404, and when the signal LOAD returns to a "Low" level, the transferred data is stored. Thereafter, a signal INC is raised to a "High" level.

The signal INC is a signal for incrementing a value of the column address counter 403, and a value of the BRD access counter 404. When the signal INC is raised to a "High" level, a value of the column address counter 403 is incremented, and when the signal INC returns to a "Low" level, the incremented internal column address is outputted from the column address counter 403. In the same way, a value of the BRD access counter 404 as well is incremented, and the incremented BRD access is outputted.

Figure 16:
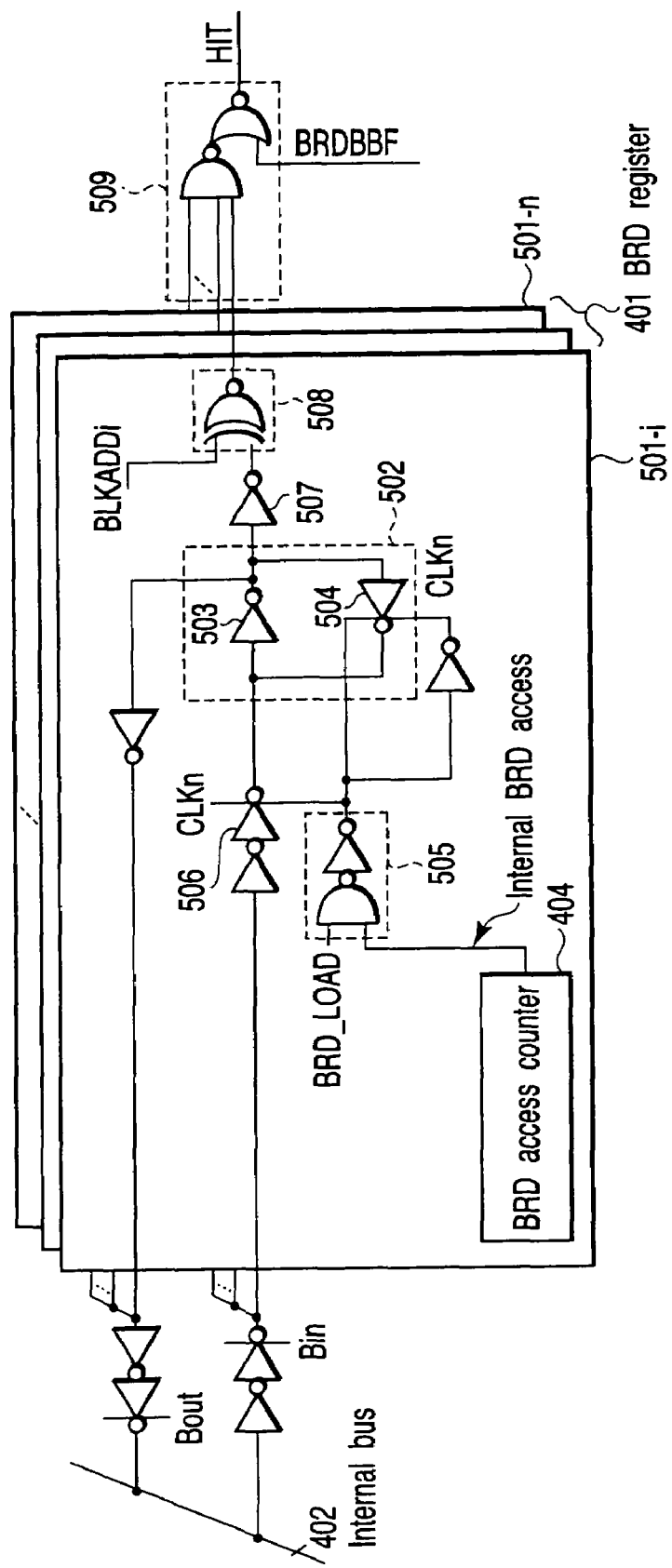
FIG. 16 is a circuit diagram showing one example of the BRD register.

Thereafter, when the signal out is again raised to a "High" level, the above-described operations are repeated. FIG. 16 is a circuit diagram showing one example of the BRD registers 401. In FIG. 16, 1 bit of the BRD registers 401 having storage capacities of, about 1 to 2 bytes (for example n bits) is shown.

As shown in FIG. 16, a register 501-i of 1 bit includes a latching circuit 502 of 1 bit. The 1-bit data transferred from the internal bus 402 during a boot sequence is stored therein. The latching circuit 502 is a static latching circuit including two inverter circuits 503 and 504. The output of the inverter circuit 503 is connected to the input of the inverter circuit 504.

The output of the inverter circuit 504 is connected to the input of the inverter circuit 503. In the present example, the inverter circuit 503 always operates while the power supply is being applied. In contrast thereto, the output operation of the inverter circuit 504 is stopped when the data is transferred from the internal bus 402. In this case, the latching circuit 502 is made to be in a state in which transfer of the data is permitted. In contrast thereto, while the inverter circuit 504 is operating, the latching circuit 502 is made to be in a state of retaining the data, i.e., in which the data is stored. The inverter circuit 504 is controlled by a control circuit 505.

The control circuit 505 in the present example includes an AND gate circuit. With respect to the control circuit 505 in the present example, for example, the block redundancy information read signal BRD_LOAD and the internal BRD access are inputted.

When both of the signal BRD_LOAD and the internal BRD access are raised to "High" levels, the control circuit 505 permits transfer of the data from the internal bus 402 to the latching circuit 502. In the present example, when transfer of the data is permitted, the control circuit 505 stops the output operation of the inverter circuit 504, and further permits the output operation of an inverter circuit 506 connected to the output of the inverter circuit 504.

When at least one of the signal BRD_LOAD and the internal BRD access returns to a "Low" level, the control circuit 505 prohibits the transfer of the data to the latching circuit 502. In the present example, when the transfer of the data is prohibited, the control circuit 505 stops the output operation of the inverter circuit 506, and further permits the output operation of the inverter circuit 504. This state is a state in which the data is stored.

The 1-bit data stored in the latching circuit 502 is inputted to an address comparison circuit 508 via an inverter circuit 507. The inverter circuit 507 is a circuit in which the data transferred from the internal bus 402 and the data inputted to the address comparison circuit 508 are made so as to be not in a negative-phase state. The address comparison circuit 508 compares 1-bit data BLKADDi outputted from the block address register 405 with the 1-bit data which is stored in the latching circuit 502, and is outputted via the inverter circuit 507. The address comparison circuit 508 in the present example includes an exclusive NOR gate circuit. When the 1-bit data BLKADDi is coincident with the 1-bit data via the inverter circuit 507, the address comparison circuit 508 raises the output to a "High" level.

One of the BRD registers 401 has the latching circuit 502 of plural bits. When all the bits of the data BLKADD are coincident with the data of all the bits stored in the latching circuit 502, a coincidence detection circuit 509 raises an output HIT thereof to a "High" level. When the output HIT is raised to a "High" level, an access destination designated by the data BLKADD which is retained in the block address register 405 is transferred to a redundant block designated by the output HIT. The NAND type flash memory according to the present example has, for example, 32 redundant blocks as shown in FIG. 9. When the NAND type flash memory has 32 redundant blocks, the output HIT is 32 at a maximum.

Further, the coincidence detection circuit 509 in the present example forcibly returns the output HIT to a "Low" level while a bad block information 1 read signal BRDBBF is being at a "High" level. The NAND type flash memory according to the present example is of a type in which a defective block is registered as a bad block. Therefore, when the output HIT is raised to a "High" level while a bad block flag register which will be described later is being set, a defective block is transferred to a redundant block, and the defective block cannot be registered as a bad block. In the present example, in order to suppress this problem, while the bad block information 1 read signal BRDBBF is being at a "High" level, the output HIT is forcibly returned to a "Low" level.

When the transfer and storage of the block redundancy information are completed, as shown in FIG. 12, a signal BRD_END is raised to a "High" level. Thereafter, when both of the signal BRD_LOAD and the signal BRD_END return to "Low" levels, the sequencer 215 raises the bad block information 1 read signal BRDBBF to a "High" level. When the signal BRDBBF is raised to a "High" level, the address information of the defective block stored in the BRD register 401 is transferred to the internal bus 402, and is retained in the block address register 405 via the internal bus 402. Thereafter, bad block flags are stored in the bad block registers BBF respectively provided to the row decoders selecting blocks (time t6).

When the data is transferred from the BRD register 401 to the internal bus 402, a gate signal given to a gate Bout is activated, for example, raised to a "High" level. In accordance therewith, the transfer of the data from the BRD register 401 to the internal bus 402 is started. Then, a gate signal given to a gate of a gate C is activated, for example, raised to a "High" level. In accordance therewith, the transfer of the data from the internal bus 402 to the block address registers 405 is started.

Figure 17:
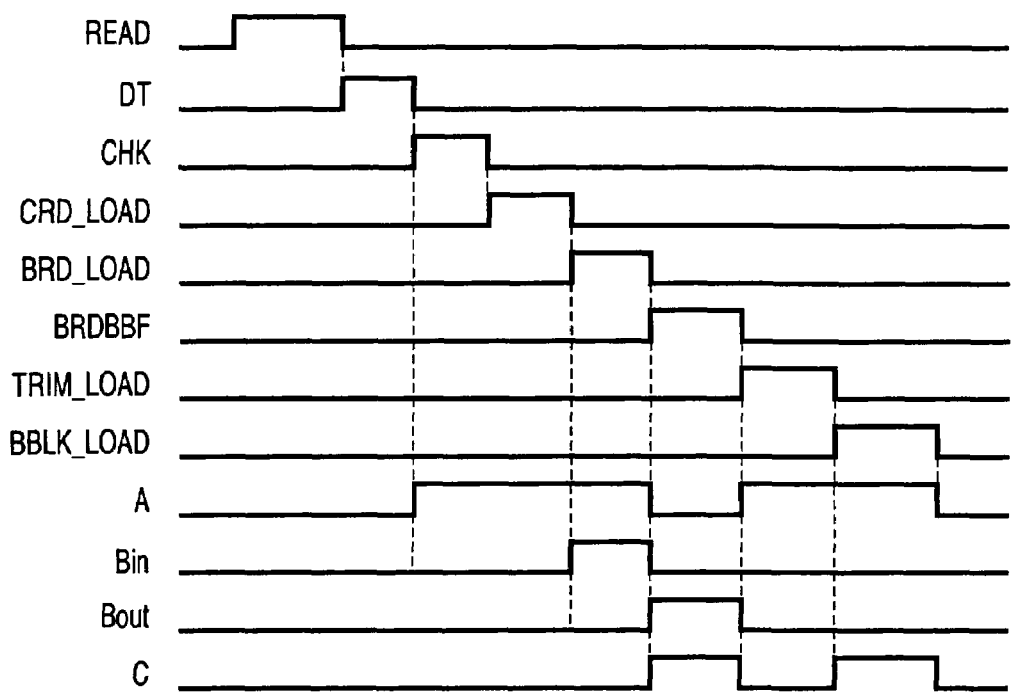
FIG. 17 is a signal waveform diagram showing one example of signal waveforms when address information of a defective block is transferred to a block address register.

One example of signal waveforms when the address information of the defective block is transferred from the BRD register 401 to the block address register 405 is shown in FIG. 17.

As shown in FIG. 17, when the address information of the defective block is transferred from the BRD register to the block address register, the signals activating the gate A and the gate Bin are made to be "Low" levels, and the signals activating the gate Bout and the gate C are raised to "High" levels. In the present example, there are a plurality of the BRD registers 401. For example, when one register is selected from among the plurality of BRD registers 401, it suffices to select it by using one of the column address counter 403 and the BRD access counter 404. Then, it suffices to serially transfer the address information of the defective block to the block address register 405. There is normally one block address register 405. However, there is a possibility that there are a plurality of the block address registers 405. When there are a plurality of the block address registers 405, the address information of the defective block may be transferred in parallel with respect to the plurality of block address registers 405. When a plurality, for example, two, three, or more of the plurality of BRD registers 401 are selected, it suffices to select those by using one of the column address counter 403 and the BRD access counter 404.

Figure 18:
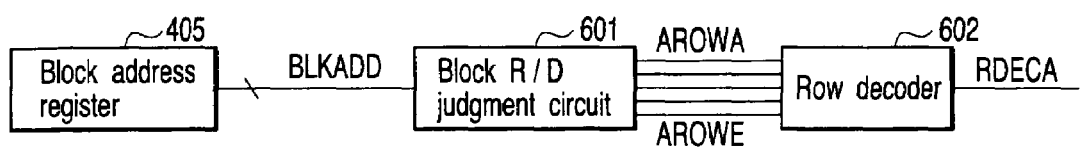
FIG. 18 is a block diagram showing one example of a relationship between a block address register and a row decoder.

One example of a relationship between the block address register and the row decoder is shown in FIG. 18.

The block address BLKADD outputted from the block address register 405 is inputted to a block redundancy judgment circuit (block R/D judgment circuit) 601. The block redundancy judgment circuit 601 is a circuit including the BRD registers 401 shown in FIGS. 14 and 16. The block address BLKADD is compared with the address information stored in the BRD registers 401 in the block redundancy judgment circuit 601, and it is judged whether or not the both are coincident with one another. When the both are coincident with one another, the output HIT is raised to a "High" level. A redundant row decoder is selected. However, in the present example, as described above, during a boot sequence, even when the both are coincident with one another, the output HIT is not raised to a "High" level. This is because the output HIT is forcibly made to be a "Low" level while the bad block information 1 read signal BRDBBF is being at a "High" level. Therefore, in the block redundancy judgment circuit 601, the block address BLKADD which is read out of the BRD registers 401 and is outputted from the block address register 405 directly selects a row decoder 602 designated by the address of the defective block. A bad block flag is set into the selected row decoder 602. Note that signals AROWA to AROWE are pre-decoded signals obtained by pre-decoding row address signals.

Figure 19:
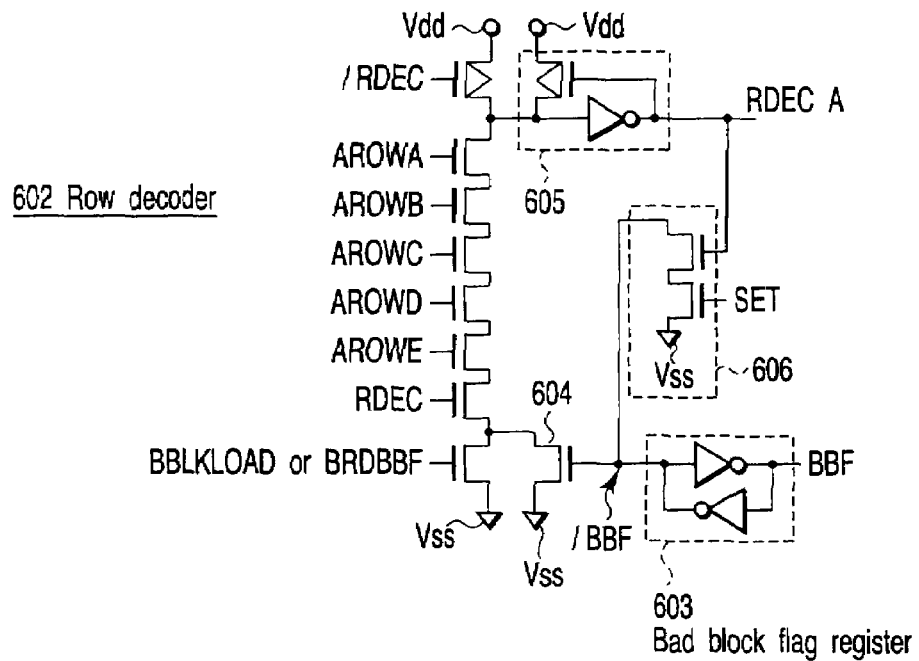
FIG. 19 is a circuit diagram showing one example a row decoder with a bad block flag register.

FIG. 19 is a circuit diagram showing one example of the row decoder with a bad block flag register.

The row decoder with a bad block flag is a row decoder having a voltage restraining function which is capable of restraining a voltage applied to a word line of a bad block in accordance with bad block information set in the bad block flag register group when a bad block is accessed.

As shown in FIG. 19, the row decoder 602 has a bad block flag register 603. One example of the bad lock flag register 603 is a latching circuit. When data for raising a node BBF to a "High" level is stored in the latching circuit, a potential of a gate of an N-channel MOS transistor 604 connected to the Vss side on the NAND row of the row decoder 602 is made to be a "Low" level, and the row decoder 602 is made to be constantly inactive. In the row decoder 602 which has been constantly inactive, even if all the pre-decoded signals AROWA to AROWE are raised to "High" levels, an output RDECA of an output latching circuit 605 is maintained to be a "Low" level. Note that signals RDEC and /RDEC are signals for controlling operational timings of the row decoder 602, and when the signal RDEC is raised to a "High" level, and the signal /RDEC is made to be a "Low" level, the pre-decoded signals AROWA to AROWE are decoded.

During a boot sequence, Setting of a bad block flag into the bad block flag register 603 is carried out. The setting of the bad block flag is carried out when the signal BRDBBF or BBLK_LOAD is at a "High" level. In a state in which the signal BRDBBF or BBLK_LOAD is at a "High" level, and a set signal SET in a flag set circuit 606 is at a "High" level, and when all the pre-decoded signals AROWA to AROWE are raised to "High" levels, an output RDECA of the output latching circuit 605 is raised to a "High" level. Thereafter, when the signal RDEC is raised to a "High" level, and the signal /RDEC is returned to a "Low" level, a node /BBF of the bad block flag register 603 is made to be a "Low" level. In this way, a bad block flag is set into the bad block flag register 603.

When the setting of the bad block flag according to the bad block information 1 is completed, as shown in FIG. 12, a signal BRDBBF_END is raised to a "High" level. Thereafter, when both of the signal BRD_BBF and the signal BRDBBF_END return to "Low" levels, the sequencer 215 raises a trimming information read signal TRIM_LOAD to a "High" level. When the signal TRIM_LOAD is raised to a "High" level, transfer of the trimming information among the fuse data retained in the data cache to the register group for storing trimming information is started, and the trimming information is stored in this register group (time t7). The register group for storing trimming information (Reg.) is disposed in, for example, the voltage control circuit (Vol) of the control circuit 202.

When the transfer and storage of the trimming information are completed, a signal TRIM_END is raised to a "High" level. Thereafter, when both of the signal TRIM_LOAD and the signal TRIM_END return to "Low" levels, the sequencer 215 raises a bad block information 2 read signal BBLK_LOAD to a "High" level. When the signal BBLK_LOAD is raised to a "High" level, transfer of the bad block information 2 among the fuse data retained in the data cache is started (time t8). Setting of a bad block flag according to the bad block information 2 may be the same as the setting of a bad block flag according to the bad block information 1. For example, the bad block information 2, i.e., the address information of the bad block is transferred to the block address register 405, and a bad block flag may be set into the row decoder 602 designated on the basis of the address information of the bad block.

When the setting of a bad block flag according to the bad block information 2 is completed, as shown in FIG. 12, the signal BBLK_LOAD is raised to a "High" level. Thereafter, when both of the signal BBLK_LOAD and the signal BBLK_END return to "Low" levels, the sequencer 215 raises a boot sequence end signal END to a "High" level. When the signal END returns to a "Low" level, the boot sequence is completed.

In accordance with the second embodiment, the boot sequence described in the first embodiment can be executed. As a result, in the second embodiment as well, in the same way as in the first embodiment, there is no duplicate information to be registered, and it is possible to efficiently use the bad block information registration area provided separately from the block replacement information registration area provided to the internal ROM or the memory cell array.

Further, in a conventional device, efficiency of the usage of the internal bus is low, and there is no means or structure for setting a bad block flag on the basis of address information of a defective block. Therefore, address information of a defective block to be replaced by a redundant block has been registered by utilizing a part or all of a bad block information registration area. This corresponds to the fact that a part or all of an area to be originally used for registration of bad block information is eroded. Therefore, it is impossible to secure an original number of blocks registerable as bad block information, which has deteriorated the production yield.

In accordance with the second embodiment, in the same way as in the first embodiment, it is possible to suppress such deterioration in the production yield.

THIRD EMBODIMENT

Figure 20:
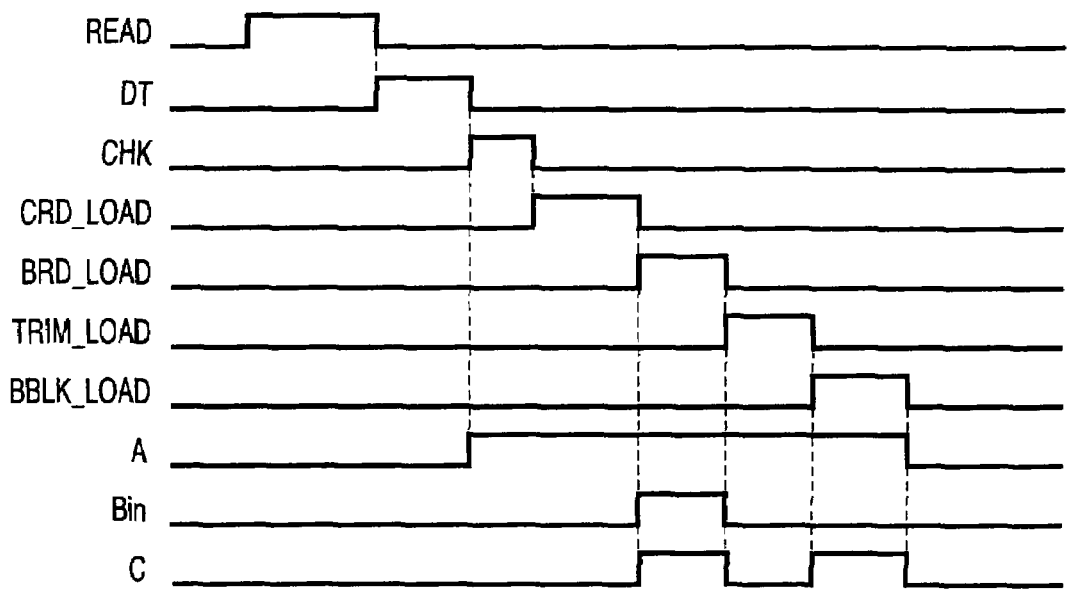
FIG. 20 is a signal waveform diagram showing one example of signal waveforms when address information of a defective block is transferred to a block address register in a semiconductor integrated circuit device according to a third embodiment of the present invention.

FIG. 20 is a signal waveform diagram showing one example of signal waveforms when address information of the defective block is transferred to the block address register, in a semiconductor integrated circuit device according to a third embodiment of the present invention.

The third embodiment is different from the second embodiment in that the address information of the defective block is transferred in parallel to the BRD registers 401 and the block address register 405.

As shown in FIG. 20, in the present embodiment, during a sequence BRD_LOAD in which the address information of the defective block is transferred, a gate signal A permitting a data output to the internal bus 402 is activated, and a gate signal Bin permitting an input to the BRD registers 401, and a gate signal C permitting an input to the block address register 405 are activated. In accordance therewith, it is possible to transmit the same data simultaneously to both of the BRD registers 401 and the block address register 405.

The BRD registers 401 store the transferred data as it is. On the other hand, the block address register 405 executes a setting operation of a bad block flag as described in the second embodiment, with respect to a block designated by the transferred data.

After this operation is completed, a value of the column address counter 403 or a BRD access counter synchronized with the column address counter 403 is changed, and address information of the following defective block is loaded out of the data cache 205, and transfer to the BRD register 401 and a setting operation of a bad block flag are sequentially executed. After the transfer of all the registered data and the setting of bad block flags are executed, the remaining predetermined boot sequence is executed.

In accordance with the third embodiment, data transfer origins and data transfer destinations which are one-on-one in the second embodiment, are made to be one-to-many, and data are transferred in parallel to the BRD registers 401 and the block address register 405. In accordance therewith, it is possible to shorten a time required for data transfer as compared with the second embodiment. Herewith, with respect to a defective block to be replaced by a redundant block, it is possible to set a bad block flag by the data of the block address register 405.

In the third embodiment as well, in the same way as in the first and second embodiments, there is no duplicate information to be registered, and it is possible to efficiently use the bad block registration area provided separately from the block replacement information registration area set in the internal ROM or the memory cell.

FOURTH EMBODIMENT

The semiconductor integrated circuit device described in the second and third embodiments can be modified as will be described in the present embodiment.

It is possible to set a bad block flag into a defective block replaced by a redundant block. A test of the semiconductor integrated circuit device is carried out even after a defective block is replaced by a redundant block (retest). At the time of this retest, there is some possibility that it is judged that the redundant block serving as a replacement destination is defective by some chance. However, it is impossible to set a bad block flag into this redundant block.

The reason for this is that, for example, in the sequence shown in FIG. 7 (reference example 2), there is only one-time procedure for transferring bad block information during a boot sequence. Namely, the procedure for transferring bad block information is only during a period for which the signal BBLK_LOAD is at a "High" level. At the time of transferring the bad block information to the bad block flag register, the block address register is utilized. At this time, when the signal HIT is raised to a "High" level, a defective block cannot be accessed, and it is impossible to set a bad block flag into the defective block. In order to prevent this problem, in the sequence shown in FIG. 7 (reference example 2), for example, during a period for which the signal BBLK_LOAD is at a "High" level, transferring of an access destination of the block redundancy judgment circuit is not carried out. For example, to correspond to the coincidence detection circuit 509 shown in FIG. 16, in a case in which the signal BRDBBF must be inputted, the signal BBLK_LOAD is inputted.

This makes it possible to select a defective block at the time of transferring the bad block information. However, in compensation for that, it is impossible to select a redundant block. As a result, as described above, it is impossible to set a bad block flag into a redundant block. Therefore, when it is judged that the redundant block serving as a replacement destination is defective by some cases in a retest after the replacement to a redundant block, shipment is not achieved. This as well deteriorates the production yield.

In contrast thereto, in accordance with the semiconductor integrated circuit device according to the second and third embodiments, it is possible to set a bad block flag into a redundant block as well. The semiconductor integrated circuit device according to the second and third embodiments executes, for example, the sequence shown in FIG. 4. Namely, there are two-time procedures for transferring bad block information of the bad block information transfer 1 (ST. 6) and the bad block information transfer 2 (ST. 8) during a boot sequence. For example, as shown in FIG. 16, only the signal BRDBBF is inputted to the coincidence detection circuit 509. This is shown concretely in FIG. 21.

As shown in FIG. 21, the block RD judgment circuit 601 includes the coincidence detection circuit 509. The coincidence detection circuit 509 does not carry out transferring of an access destination while the bad flag register group is set in accordance with the address information of the defective block. Namely, during a period for which the signal BRDBBF is at a "High" level, it is possible to set a bad block flag into the bad block flag register (BBF) 603 of the normal row decoder 602N included in the normal decoder portion 204N.

Moreover, the coincidence detection circuit 509 can carry out transferring of an access destination during a period for which the bad flag register group is set in accordance with the address information of the bad block. For example, in accordance with the coincidence detection circuit 509 shown in FIGS. 16 and 21, because the signal BBLK_LOAD is not inputted, the signal HIT can be raised to a "High" level during a period for which the signal BBLK_LOAD is at a "High" level.

By utilizing this, in the semiconductor integrated circuit device according to the fourth embodiment, the bad block flag register (BBF) 603 which is the same as the normal row decoder 602N is provided to the redundant row decoder 602R included in the redundant decoder portion 204R. Then, it suffices to set a bad block flag into the bad block flag register 603 of the redundant row decoder 602R during a period for which the signal BBLK_LOAD is at a "High" level.

As one example thereof, an address is assigned to the redundant row decoder 602R. The address assigned to the redundant row decoder 602R is called a redundant address for convenience. Redundant address information of a redundant block which has brought about a defect among the redundant blocks is registered with, for example, the block replacement information registration area 1100 shown in FIG. 6. Then, the redundant address information of the redundant block which has brought about a defect is set in the BRD register 401 along with the address information of the defective block (normal block).

Further, the redundant address information of the redundant block which has brought about a defect is registered with, for example, the bad block information registration area 1300 shown in FIG. 6. Then, it suffices to set a bad block flag into the bad block flag register 603 of the normal row decoder 602N, and the bad block flag register 603 of the redundant row decoder 602R.

In accordance with the fourth embodiment, it is possible to set a bad block flag into a redundant block as well. Then, when it is judged by some cases that the redundant block serving as a replacement destination is defective in a retest after the defective block is replaced by a redundant block, a bad block flag is set into the redundant block as well at the time of boot sequence. In accordance therewith, it is possible to ship even devices which have not been able to be shipped. Accordingly, it is possible to further improve the production yield as compared with those in the first to third embodiments.

FIFTH EMBODIMENT

In accordance with the fourth embodiment, it is possible to set a bad block flag into a redundant block as well. By utilizing this, it is possible to obtain two types of products from one mask set. Hereinafter, this will be described as a fifth embodiment.

(First Type)

FIGS. 22A to 22C are diagrams showing a first type which can be employed by a semiconductor integrated circuit device according to the fifth embodiment.

In the first type, a memory cell array is divided into a normal array and a redundant array. A total number of blocks is 2080 in the present example. Among the 2080 blocks, for example, 2048 blocks are used as normal blocks, and 32 blocks are used as redundant blocks. The 32 redundant blocks are used only for a manufacturer, and are not open to users. The first type is a type which is shipped such that the number of normal blocks is set as a maximum value of the number of available blocks (good blocks) before shipping. In the present example, a maximum value of the number of available blocks before shipping is 2048.

FIG. 22A shows a state in which there is no defective block. In this state, the 2048 normal blocks are used. The 32 redundant blocks are not used. A usable block and a nonusable block are shown in FIG. 22C.

FIG. 22B shows a state in which there is one defective block. In this state, the 2047 normal blocks are used, and one defective block is replaced by one redundant block. Namely, the one redundant block is used, and the 31 redundant blocks are not used. The defective block is registered as a bad block.

Further, although not illustrated in particular, the number of defective blocks is over 32 in some cases. In this case, 32 defective blocks are replaced by the 32 redundant blocks. The excess defective blocks which cannot be replaced by redundant blocks are merely registered as bad blocks, and are disabled. In this case, the number of available blocks is reduced to be less than 2048. However, provided that a maximum value and a minimum value of available blocks before shipping are determined in advance, there is no problem. For example, it is recommended that the number of available blocks before shipping be determined as 2048 at a maximum, and 2008 at a minimum. By utilizing this, the first type is a product in which it is recommended that the replacement of redundant blocks and the registration of bad blocks be carried out such that the number of available blocks is within a range of 2008 to 2048.

Note the fact that it is possible to register a redundant block as a bad block in the first type which can be employed by the semiconductor integrated circuit device according to the fifth embodiment, as described in the fourth embodiment.

(Second Type)

Figure 23A:
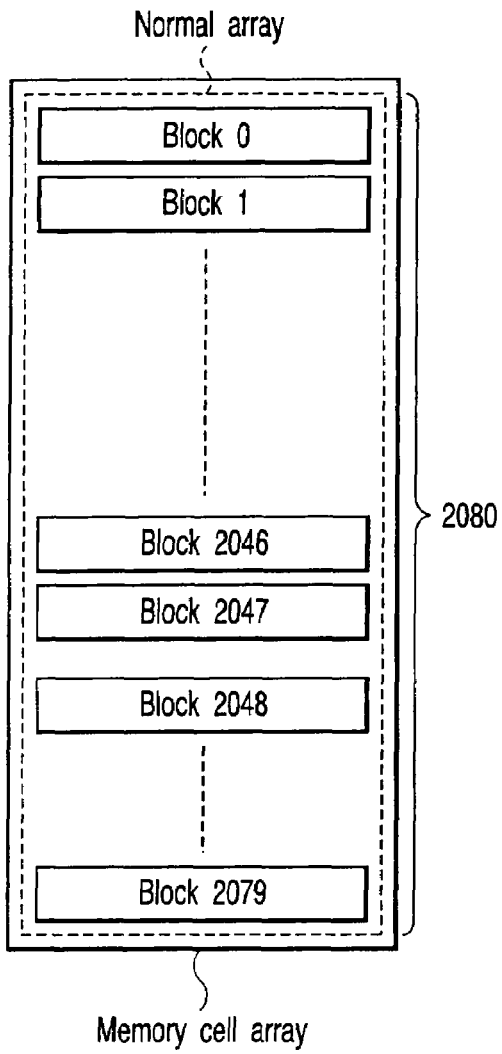
FIGS. 23A to 23C are diagrams showing a second type which can be employed by the semiconductor integrated circuit device according to the fifth embodiment of the present invention.
Figure 23B:
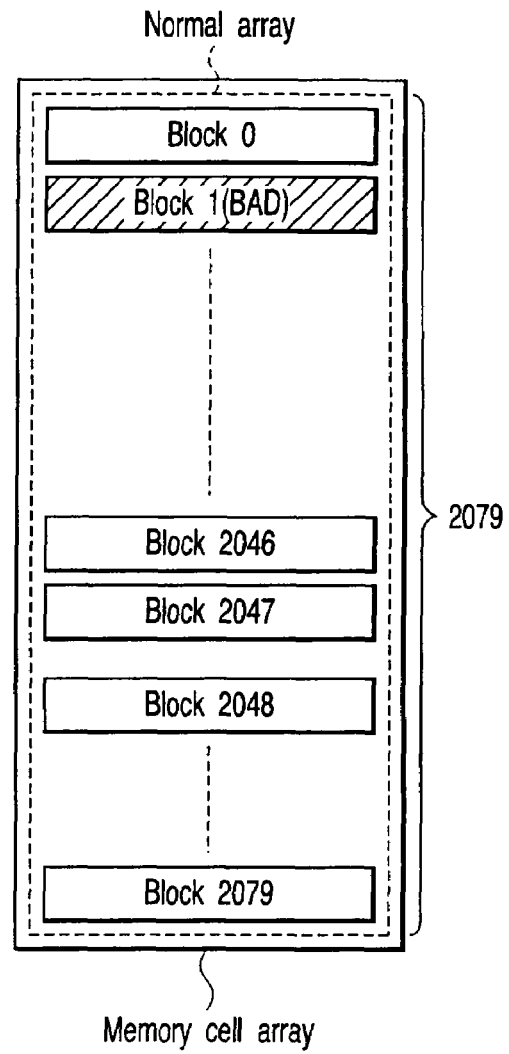
Figure 23C:
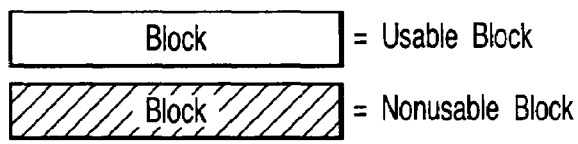

FIGS. 23A to 23C are diagrams showing a second type which can be employed by the semiconductor integrated circuit device according to the fifth embodiment.

In the second type, in contrast to the first type, a memory cell array is not divided into a normal array and a redundant array. Namely, in the second type, all the blocks on the chip are open to users. The second type is, in contrast to the first type, a type which is shipped such that the number of all the blocks on the chip is set as a maximum value of the number of available blocks before shipping. Then, a minimum value of the number of available blocks before shipping is determined in advance, and the shipment is achieved. In the present example, a maximum value of the number of available blocks before shipping is 2080, and a minimum value of the number of available blocks is 2008.

FIG. 23A shows a state in which there is no defective block. In this state, all the 2080 blocks on the chip are used. The number of available blocks before shipping is 2080.

FIG. 23B shows a state in which there is one defective block. In this state, the one defective block is registered as a bad block. The number of available blocks before shipping is 2079. In the present embodiment, the block 1 which is a normal block is registered as a bad block, and is disabled in the first type. However, in the first type, the blocks of 2048 to 2079 which are redundant blocks as well can be registered as bad blocks by utilizing the fourth embodiment.

In accordance with the fifth embodiment, by utilizing the fourth embodiment, one of the first type in which a memory cell array is divided into a normal array and a redundant array, and the second type in which a memory cell array is not divided into a normal array and a redundant array can be selected. It may be determined depending on a user's taste which type is selected.

Further, these first and second types can be obtained from one mask set. Therefore, there is no need for a manufacture to manage the mask set separately for each type, or to change the production line, or to change the production process. Accordingly, those types are advantageous to restraint of a rise in the cost of manufacturing, or to reduction in the cost of manufacturing. Further, those types are advantageous in that a product of a type according to a user's taste is rapidly supplied to the user.

Moreover, these first and second types can be switched to one another, for example, by inputting a command.

MODIFIED EXAMPLE

In the fifth embodiment, one of the first type in which a memory cell array is divided into a normal array and a redundant array, and the second type in which a memory cell array is not divided into a normal array and a redundant array can be selected. A nonvolatile semiconductor memory having the first type or the second type, for example, a NAND type flash memory is utilized for a recording medium such as a memory card or the like. The recording medium is controlled by a host device. The host device issues an address with respect to the recording medium. The recording medium carries out erasing, writing, and reading of data with respect to an address corresponding to the received address.

There is an advantage of the first type that it is difficult to limit an address signal which the host device issues. The number of normal blocks disposed in the normal array is a power of "2". Namely, it is the number of "4, 8, 16, . . . , 512, 1024, 2048, 4096, . . . ". An address signal which the host device issues is a combination of signals of 0 and 1 of plural bits. Provided that an address signal has 2 bits, one can be selected from the "4" blocks. Provided that an address signal has 3 bits, one can be selected from the "8" blocks. In the same way, as the number of bits increases, one can be selected from the "16, . . . , 512, 1024, 2048, 4096, . . . " blocks. In this way, the number of normal blocks is coincident with the number of blocks which an address signal can select. Therefore, in the first type, for example, it is easy to correspond an address which the host issues, to an address in the chip. Further, it is possible to eliminate the state in which there is no block corresponding to the logic of an address signal. This does not make system limitation of the host device. A host device corresponding to the first type is the mainstream of current host devices.

In contrast thereto, there is an advantage of the second type that the number of blocks which a user can use increases more than that in the first type. However, the number of blocks is shifted from a power of "2". Therefore, the state in which there is no block corresponding to the logic of an address signal is brought about. This might make system limitation of the host device. In this way, in the second type, it is easy to limit the system of the host device.

Then, in the modified example of the fifth embodiment, a recording medium in which the second type is used without limiting the system of the host device is provided.

Figure 24:
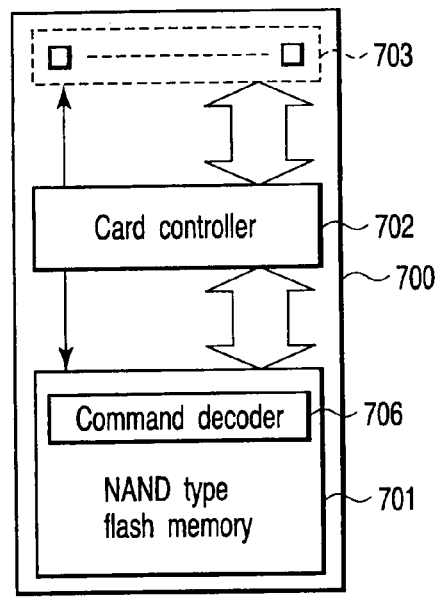
FIG. 24 is a block diagram showing one example of a recording medium according to a modified example of the fifth embodiment of the present invention.

FIG. 24 is a block diagram showing one example of a recording medium according to the modified example of the fifth embodiment.

As shown in FIG. 24, one example of a recording medium is a memory card 700. The memory card 700 internally has a nonvolatile semiconductor memory, for example, a NAND type flash memory 701, and a card controller 702 controlling the memory 701. The card controller 702 is connected to an external terminal group 703 of the memory card 700. The external terminal group 703 is a terminal group capable of being electrically connected to a host device.

Figure 25:
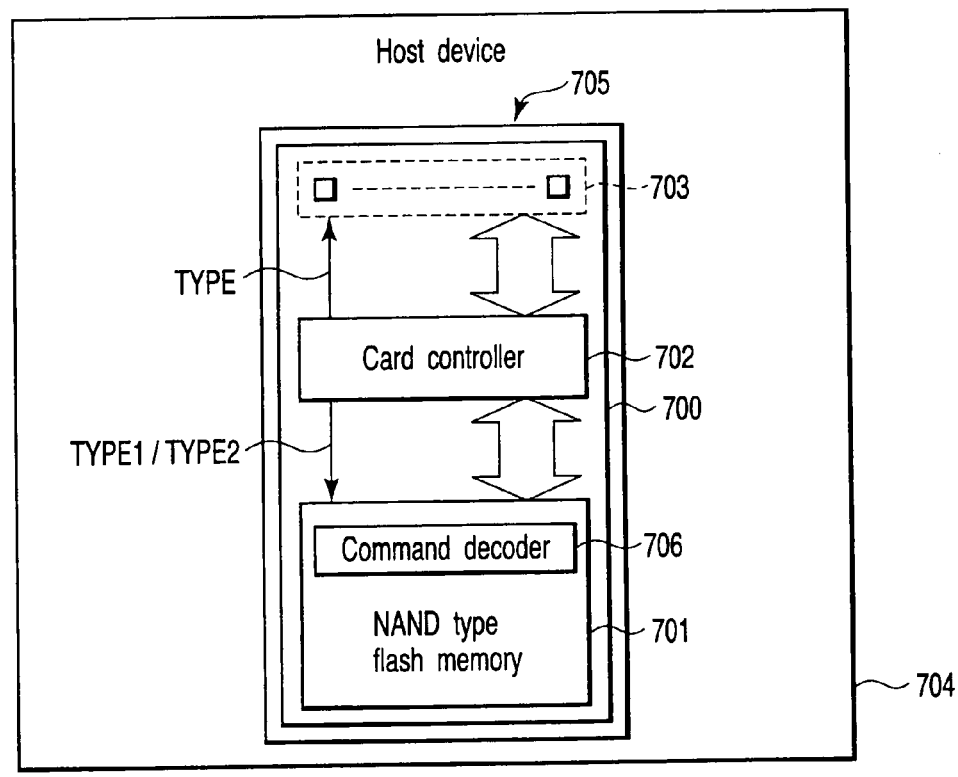
FIG. 25 is a diagram showing a state in which the recording medium according to the modified example of the fifth embodiment of the present invention is mounted on a host device.

As shown in FIG. 25, when the memory card 700 is mounted in a card slot 705 of a host device 704, the card controller 702 in the present example outputs a detection signal TYPE to the host device 704.

When there is no reply to the detection signal TYPE from the host device 704, the card controller 702 recognizes that, for example, "the host device 704 cannot handle the second type". The card controller 702 outputs a type recognition command TYPE1 to the NAND type flash memory 701. The type recognition command TYPE1 is inputted to the NAND type flash memory 701, and is inputted to, for example, a command decoder 706 in the memory 701. The command decoder 706 decodes the type recognition command TYPE1, and selects the first type between the first and second types, and sets the circuit inside the NAND type flash memory 701 so as to operate afterward as a product of the first type.

In contrast thereto, when there is a reply to the detection signal TYPE from the host device 704, the card controller 702 recognizes that, for example, "the host device 704 corresponds to the second type". The card controller 702 outputs a type recognition command TYPE2 to the NAND type flash memory 701. The type recognition command TYPE2 is inputted to the NAND type flash memory 701. The type recognition command TYPE2 as well is inputted to, for example, the command decoder 706 in the NAND type flash memory 701. The command decoder 706 decodes the type recognition command TYPE2, and selects the second type between the first and second types, and sets the circuit inside the NAND type flash memory 701 so as to operate afterward as a product of the second type.

Note that one example of setting of the internal circuit is such that, when the command TYPE1 is received, an operation of transferring an access destination of the block redundancy judgment circuit during setting of the block replacement information register group during a boot sequence, and in operation is permitted, and when the command TYPE2 is received, an operation of transferring an access destination of the block redundancy judgment circuit during operations is prohibited.

In accordance with the present modified example, the device is not only a product supporting the second type, but also can be both of the first type and the second type by receiving the type recognition commands TYPE1 and TYPE2. Accordingly, in accordance with the present modified example, it is possible to obtain a recording medium in which the second type can be used without limiting the system of the host device.

SIXTH EMBODIMENT

A sixth embodiment relates to an internal bus structure.

Figure 26:
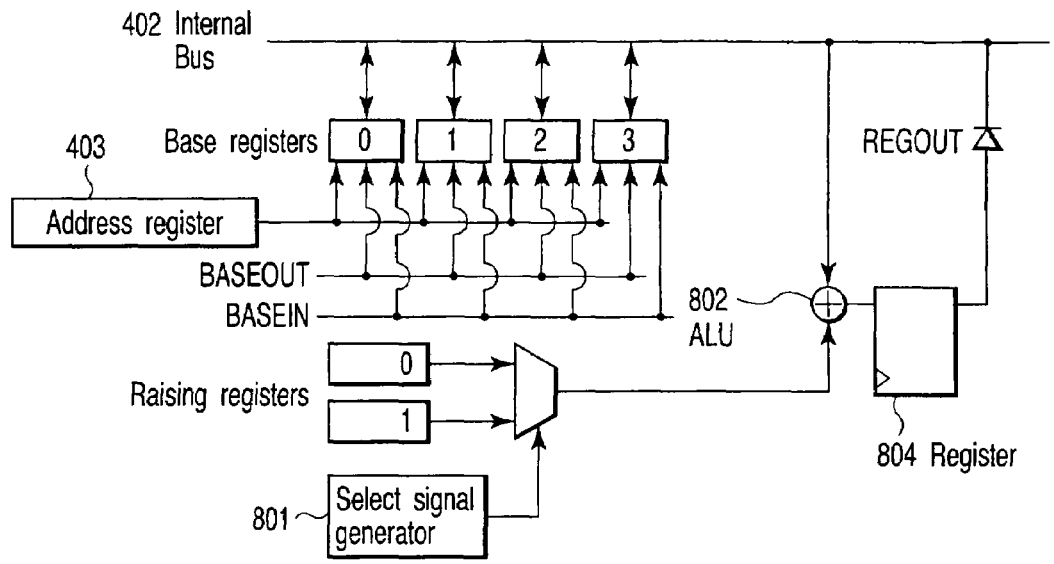
FIG. 26 is a block diagram showing one example of a semiconductor integrated circuit device according to a sixth embodiment of the present invention.

FIG. 26 is a block diagram showing one example of a semiconductor integrated circuit device according to the sixth embodiment.

As shown in FIG. 26, for example, four sets of base registers 0 to 3 for setting write voltage setting value or the like with respect to an device are provided. Means for outputting data thereof to the internal bus is well-known.

Figure 27:
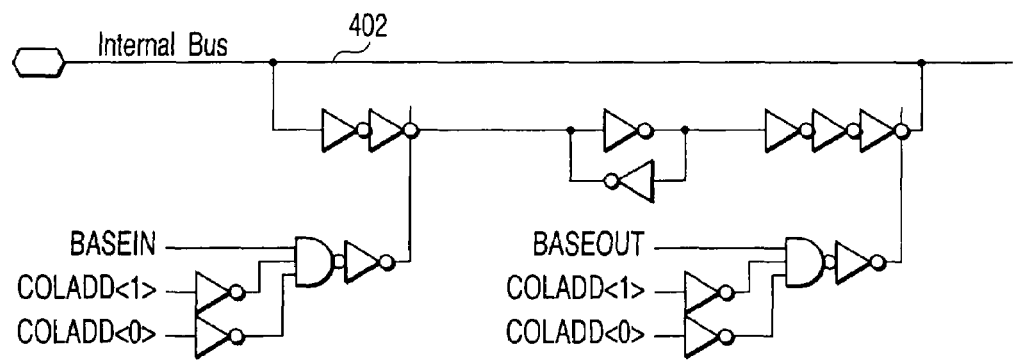
FIG. 27 is a circuit diagram showing one example of a circuit of a base register shown in FIG. 26.

A signal for determining to output data from which base register is generally determined by a select signal generator. Suppose that this is determined by an address register, for example, a column address register (or a column address counter). FIG. 27 is a circuit diagram showing one example corresponding to the base register 0. Data of the base register is permitted to be outputted to the internal bus 402 by decoding a data output permission signal BASEOUT of the base register and data of the column address register. A register data granting permission is not limited to an address register, for example, a column address register, and another existing register may be utilized for this purpose.

In contrast thereto, a signal for selecting to use data of which raising register is selected by an existing select signal generator 801.

Figure 28:
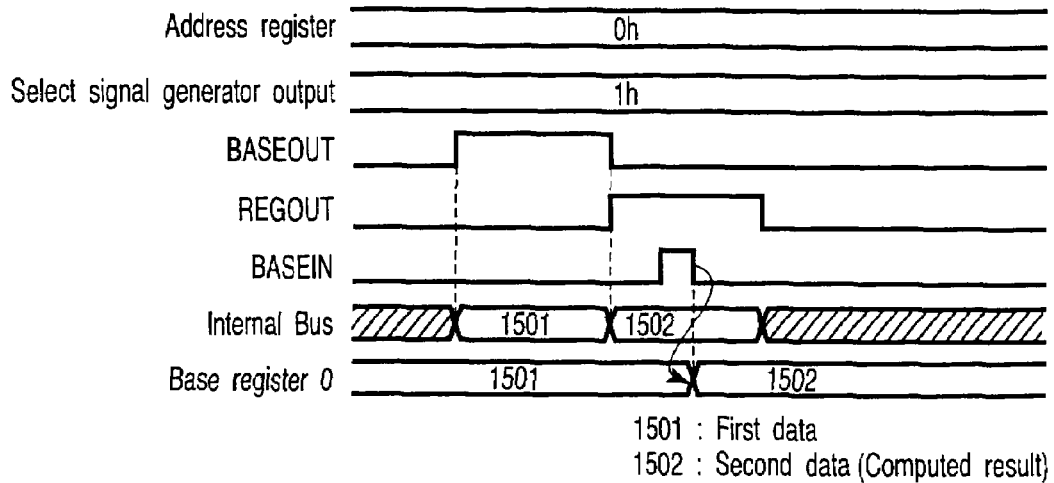
FIG. 28 is a signal waveform diagram showing one example of operations of the semiconductor integrated circuit device according to the sixth embodiment of the present invention.

In the sixth embodiment, it is possible to select a base register and a raising register in an arbitrary combination by an independent select signal. In the present embodiment, the data of the base register uniquely determined by the column address register is inputted to an arithmetic and logical unit (ALU) 802 via the internal bus 402. On the other hand, the data of the raising register uniquely determined by the select signal generator 801 is inputted to the ALU 802, and the data calculated thereby is inputted to a register 804. The data of the register 804 is outputted to the internal bus in a predetermined timing. At this time, the output of the data of the base register which has been outputted up to that time is stopped. On the other hand, by loading in the data outputted to the internal bus 402, for example, a result of calculating the raising data stored inside the device can be returned to the base register. One example of a series of these operations is shown in FIG. 28. The returned data is generally written into a place which can be read out by an automatic reading sequence at the time of power-on by using means for writing data into a well-known nonvolatile semiconductor memory cell.

Figure 29:
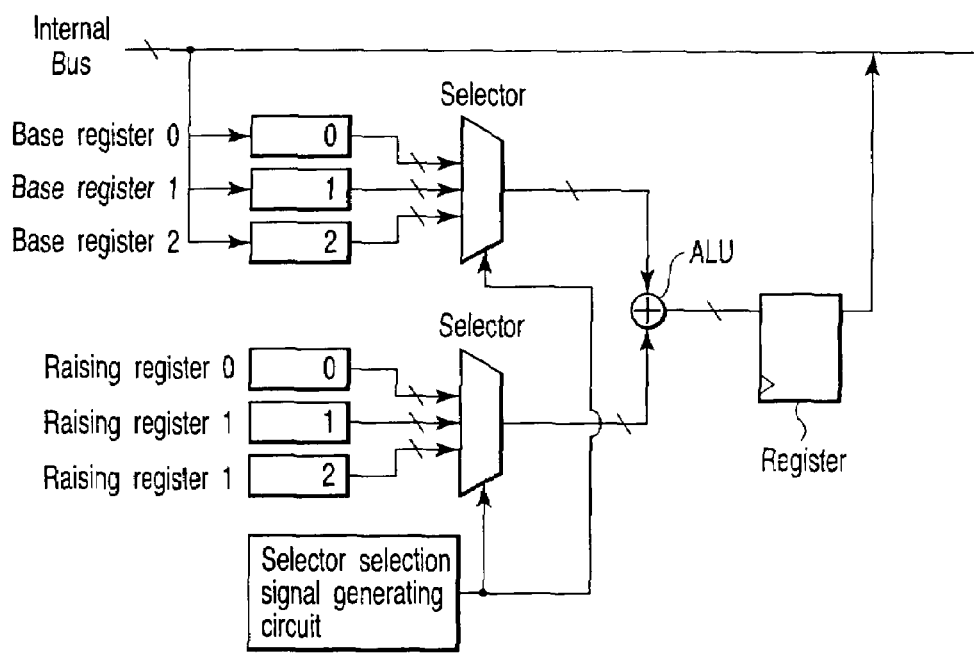
FIG. 29 is a circuit diagram showing a base register according to the reference examples.

In a general structure, it is necessary to possess the raising registers corresponding to the base registers one-on-one, for example, as shown in FIG. 29, and when the number of base registers increases, it is necessary to increase the number of raising registers in proportion thereto.

In contrast thereto, in accordance with the sixth embodiment, there is no need to make raising registers correspond to base registers one-on-one. Namely, the number of raising registers may be less than the number of base registers. Moreover, it is possible to reflect a calculated result by the same raising register with respect to a plurality of base registers.

FIG. 30 is a circuit diagram showing one example of the semiconductor integrated circuit device according to the sixth embodiment.

In the present example, the select signal generator 801 is a select signal register as shown in FIG. 30. In the present example, due to the select signal generator 801 being a select signal register, it is possible to select a raising register independently of a base register selected by data of an address register. For example, when "0" is set into the select signal register, the raising register 0 can be selected, and when "1" is set into the select signal register, the raising register 1 can be selected. When data is set into the select signal register, for example, at the time of setting data into the address register, i.e, at the time of selecting a base register, a raising value "0" or "1" may be transferred to the select signal register along with a base value to be transferred to the selected base register.

Further, the sixth embodiment is applied to setting of trimming information for setting a writing voltage setting value or the like for the device, and for example, can be used for the transfer of trimming information in boot sequence shown in FIG. 4.

Further, the sixth embodiment can be used not only for the transfer of trimming information during a boot sequence shown in FIG. 4, but also for the transfer of trimming information during operations. For example, in some cases, when writing results in failure during use of a nonvolatile semiconductor memory, for example, a NAND type flash memory, the writing is retried. In this retry, a writing voltage before the retry is generally used. However, a writing voltage in the retry can be changed to a writing voltage before the retry. In order to change a writing voltage, it suffices to change the trimming information. In order to change the trimming information, it suffices to change a raising register to be selected. Then, the data of the base register and the data of the raising register are again calculated by the ALU 802, and it suffices to return the calculated result to the base value register, and to set it again.

Moreover, in the sixth embodiment, it is possible to obtain the following advantage.

This advantage is that a test for a base register can be carried out more precisely.

For example, in the reference example shown in FIG. 29, at the time of testing a base register, test pattern data from a tester is set into the base register via the internal bus. Thereafter, the test pattern data set into the base register is read out, and is returned to the tester via the internal bus. It is judged whether or not the returned read result is as expected, and it is judged whether or not there is anything wrong with the base register.

However, in the reference example shown in FIG. 29, before the test pattern data set in the base register is returned to the internal bus, the data passes through the selector, the arithmetic and logical unit, and the register. Therefore, if it is judged that there is something wrong, it is impossible to know which of the base register, the selector, the arithmetic and logical unit, and the register is wrong. Therefore, when it is judged that there is something wrong, it is necessarily judged that there is something wrong with the entire circuit shown in FIG. 29. When there is no spare circuit for the circuit shown in FIG. 29, at a point in time it is judged that there is something wrong therewith, the chip is judged as defective, and will be not shipped. Further, even if there is a spare circuit, the entire circuit shown in FIG. 29 is regarded as a spare circuit. In addition, because it is necessary to prepare several sets of spare circuits in order to improve the yield, it is disadvantageous to a reduction in a chip area.

In contrast thereto, for example, as shown in FIG. 26, the semiconductor integrated circuit device according to the sixth embodiment has a path through which the data set in the base register is returned directly to the internal bus 402. Therefore, it is possible to directly return the test pattern data set in the base register to the internal bus without passing through the arithmetic and logical unit and the register. Namely, in the semiconductor integrated circuit device according to the sixth embodiment, it is possible to directly test a base register by the tester. If it is judged there is something wrong therewith, it suffices to disable only that base register. There are several sets of base registers in the chip, and all of those are not necessarily used. Namely, it is sufficiently permitted to disable several base registers.

In this way, in accordance with the sixth embodiment, it is possible to carry out a test for a base register more precisely as compared with the reference example shown in FIG. 29. Moreover, it suffices to disable only the base register when it is judged there is something wrong therewith, which is advantageous to the improvement in the yield.

It goes without saying that a spare base register may be prepared. In this case, because only a spare base register is prepared, and there is no need to prepare the entire circuit as a spare circuit as in the reference example shown in FIG. 29, it is advantageous to a reduction in a chip area.

Moreover, as a fact which is advantageous to a reduction in a chip area, the sixth embodiment has a point that the number of wirings is reduced as compared with the reference example shown in FIG. 29.

For example, in the reference example shown in FIG. 29, wirings through which the outputs of the base registers are transferred are required in parallel with the internal bus, from the base registers to the selector and the arithmetic and logical unit.

In contrast thereto, in accordance with the semiconductor integrated circuit device according to the sixth embodiment, the outputs of the base registers are transferred to the internal bus, for example, as shown in FIG. 26. Thus, wirings through which the outputs of the base registers are transferred are not required in parallel with the internal bus up to the ALU 802.

In this way, in the sixth embodiment, the number of wirings is reduced as compared with the reference example shown in FIG. 29, which is advantageous to a reduction in a chip area as well.

SEVENTH EMBODIMENT

Next, an example of a recording medium utilizing a nonvolatile semiconductor memory according to the embodiment of the present invention, for example, a memory card will be described as a seventh embodiment.

Figures 31, 32:
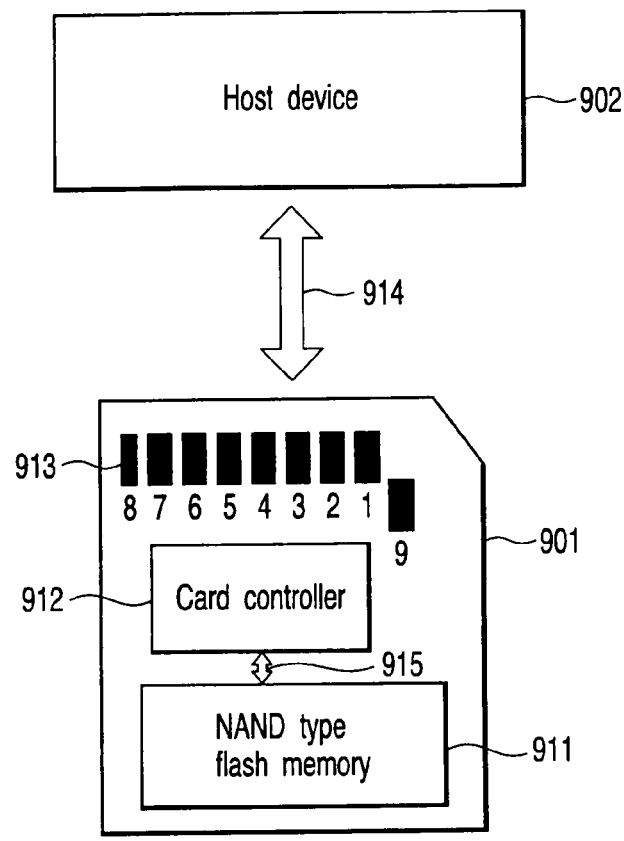
FIG. 31 is a diagram showing one example of a recording medium according to a seventh embodiment of the present invention.
FIG. 32 is a diagram showing one example of assignment of signals with respect to signal pins.

FIG. 31 is a diagram showing one example of a recording medium according to the seventh embodiment of the present invention. In the present example, a memory card is shown as a recording medium. Then, a memory card having a nonvolatile semiconductor memory and a card controller controlling the nonvolatile semiconductor memory is exemplified. One example of a nonvolatile semiconductor memory is a flash memory. One example of a flash memory is a NAND type flash memory.

As shown in FIG. 31, a memory card 901 carries out transmission and reception of information with a host device 902 via a bus interface 914. The memory card 901 is formed so as to be inserted into and taken out from a slot provided to the host device 902.

The memory card 901 has a flash memory 911, a card controller (memory controller) 912 for controlling the flash memory 911, and a plurality of signal pins (the first pin to the ninth pin) 913. The signal pins 913 are pins electrically connected to the card controller 912, and function as external pins of the memory card 901. One example of assignment of signals with respect to the first pin to the ninth pin in the signal pins 913 is shown in FIG. 32.

As shown in FIG. 32, Data 0 to Data 3 are respectively assigned to the seventh pin, the eighth pin, the ninth pin, and the first pin. Note that the first pin is assigned not only to the Data 3, but also to a card detection signal. Moreover, the second pin is assigned to a command, and the third pin and the sixth pin are assigned to a ground potential Vss, the fourth pin is assigned to a power supply potential Vdd, and the fifth pin is assigned to a clock signal.

The signal pins 913 and a bus interface 914 are used for communication between a host controller (not shown) in the host device 902 and the memory card 901. For example, the host controller performs communication of various signals and data with the card controller 912 in the memory card 901 via the first pin to the ninth pin. For example, when data is written into the memory card 901, the host controller transmits a write command to the card controller 912 via the second pin. At this time, the card controller 912 receives the write command supplied to the second pin in response to a clock signal supplied to the fifth pin. The second pin assigned to an input of command is disposed between the first pin for the Data 3 and the third pin for the ground potential Vss.

In contrast thereto, communication between the flash memory 911 and the card controller 912 is performed via an interface for a NAND type flash memory. For example, it is an 8-bit IO line (data line) 915.

When the card controller 912 writes data into the flash memory 911, the card controller 912 sequentially inputs a data input command 80$h$, a column address, a page address, data, and a program command 10$h$ into the flash memory 911 via the IO line 915. Here, "h" of the command 80$h$ denotes a hexadecimal number, and in practice, an 8-bit signal of "10000000" is provided in parallel to the 8-bit IO line 915. Namely, with respect to the interface for a NAND type flash memory, a plural-bit command is issued in parallel. Further, with respect to the interface for a NAND type flash memory, communication of a command and data with respect to the flash memory 911 is performed so as to share the same IO line 915.

In this way, an interface through which the host controller and the card controller 912 communicate, and an interface through which the flash memory 911 and the card controller 912 communicate are different from one another.

Figure 33:
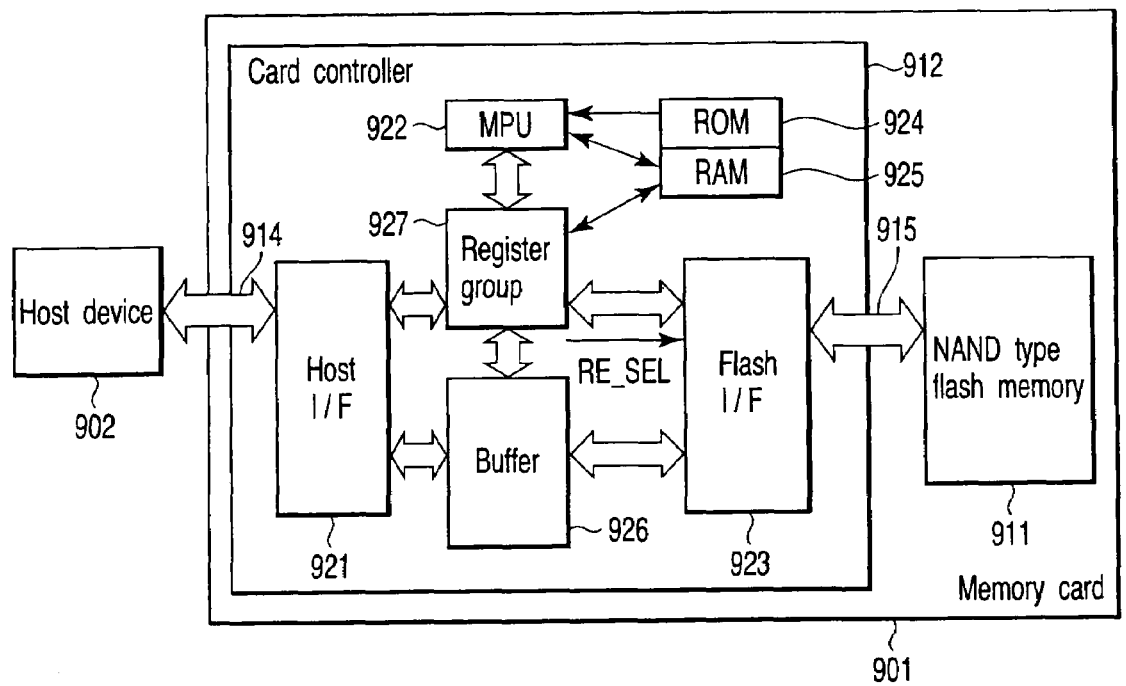
FIG. 33 is a block diagram showing one example of a hardware structure of the recording medium according to the seventh embodiment of the present invention.

FIG. 33 is a block diagram showing one example of a hardware structure of the memory card according to the embodiment.

The host device 902 has hardware and software for accessing to the memory card 901. The memory card 901 is operated by receiving a power supply at the time of connecting to the host device 902, and carries out processing according to an access from the host device 902.

With respect to the flash memory 911, an erasing block size at the time of erasing (a block size as an erasing unit) is set to a predetermined size (for example, 256 kB). Further, writing and reading of data are carried out in units called page (for example, 2 kB) with respect to the flash memory 911.

The card controller 912 manages a physical state inside the flash memory 911 (for example, what number logical sector address data is included in which physical block address, or which block is in an erased state). The card controller 912 has a host interface 921, an MPU (Micro processing unit) 922, a flash interface 923, a ROM (Read-only memory) 924, a RAM (Random access memory), a buffer 926, and a register group 927.

The host interface 921 carries out interface processing between the card controller 912 and the host device 902.

The register group 927 has various registers. One example of the register group 927 is shown in FIG. 34.

Figure 34:
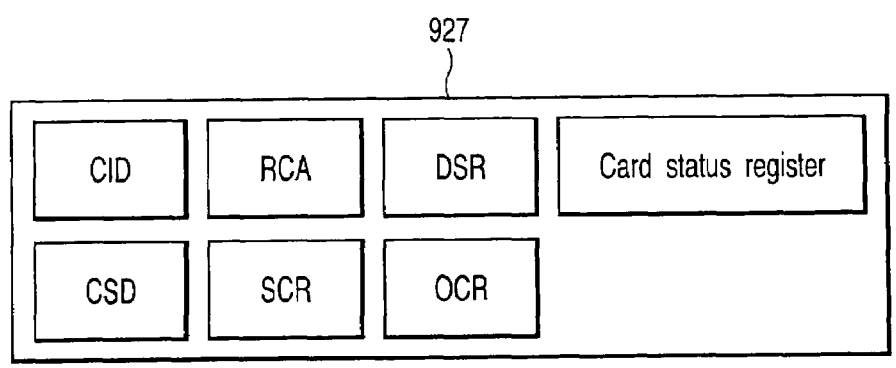
FIG. 34 is a diagram showing one example of a register group shown in FIG. 33.

As shown in FIG. 34, the register group 927 includes a card status register, and a CID, an RCA, a DSR, a CSD, an SCR, and an OCR. These registers are defined as follows.

The card status register is used for normal operations, and for example, error information is stored therein.

The CID, RCA, DSR, CSD, SCR, and OCR are mainly used at the time of initializing the memory card.

An individual number of the memory card 901 is stored in the CID (Card identification number). A relative card address is stored in the RCA (Relative card address). A relative card address is determined by the host device 902 at the time of initializing. A bus driving force of the memory card 901 and the like are stored in the DSR (Driver stage register). Characteristic parameter values of the memory card 901 are stored in the CSD (Card specific data). For example, those are version information, performance identification codes, performance parameters, and the like. A data layout of the memory card 901 is stored in the SCR (SD configuration data register). An operating voltage in the case of a memory card having limitations on an operating range voltage is stored in the OCR (Operation condition register).

The MPU 922 controls operations of the entire memory card 901. For example, when a power supply is applied to the memory card 901, the MPU 922 executes predetermined processing by reading firmware (a control program) stored in the ROM 924 onto the RAM 925, thereby forming various tables on the RAM 925.

Further, the MPU 922 receives a write command, a read command, and an erasing command from the host device 902, and executes predetermined processing onto the flash memory 911, or controls data transfer processing through the buffer 922.

The ROM 924 stores a control program controlled by the MPU 922, and the like. The RAM 925 is used as a working area of the MPU 922, and stores a control program and various tables. The flash interface 923 carries out interface processing between the card controller 912 and the flash memory 911.

The buffer 926 temporarily stores a given amount of data (for example, an amount of one page) when the data transmitted from the host device 902 is written into the flash memory 911, or temporarily stores a given amount of data when the data read from the flash memory 911 is transmitted to the host device 902.

Figure 35:
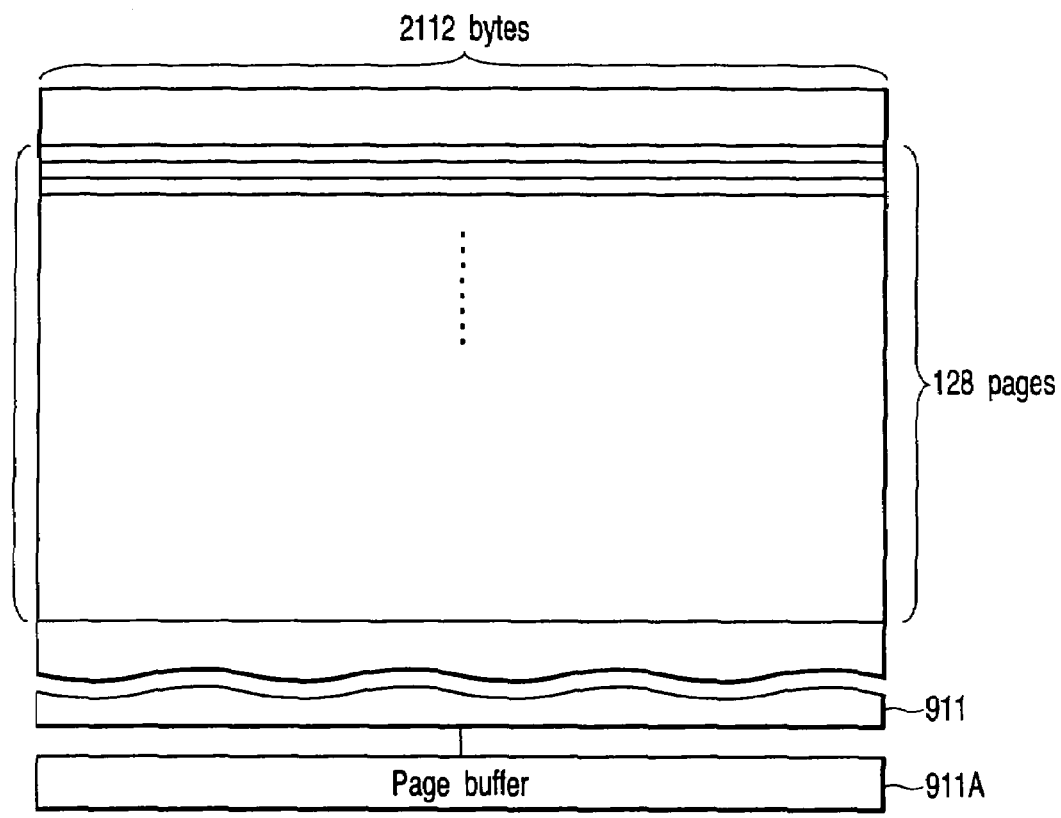
FIG. 35 is a diagram showing one example of a data layout in a flash memory.

One example of a data layout of the flash memory 911 is shown in FIG. 35.

As shown in FIG. 35, each page of the flash memory 911 has, for example, 2112 bytes (four data storage units of 512 bytes, ten redundancy units of 10 bytes and a management data storage unit of 24 bytes). Further, for example, an amount of 128 pages is an erasing unit (256 k bytes+8 k bytes (where k is 1024)). An erasing unit is called a block.

The flash memory 911 has a page buffer 911A for carrying out data input/output with respect to the flash memory 911. One example of a storage capacity of the page buffer 911A is 2112B (2048B+64B). At the time of writing data or the like, the page buffer 911A executes processing for data input/output with respect to the flash memory 911 in units of one page corresponding to its own storage capacity. One example of data storage areas of the flash memory 911 is shown in FIG. 36.

Figure 36:
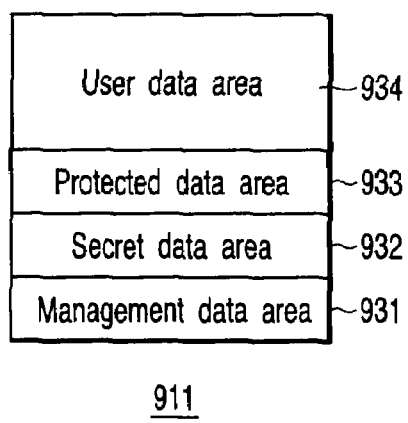
FIG. 36 is a diagram showing one example of data storage areas in the flash memory.

As shown in FIG. 36, an area into which the data of the flash memory 911 is written (a data storage area) is divided into a plurality of areas in accordance with data to be stored. The flash memory 911 has, as the data storage areas, for example, a management data area 931, a secret data area 932, a protected data area 933, and a user data area 934.

The management data area 931 mainly stores management information on the memory card. The management data area 931 stores, for example, security information on the memory card 901 and card information such as a medium ID and the like.

The secret data area 932 stores key information used for encoding and secret data used at the time of authentication. The secret data area 932 is an area to which it is impossible to access from the host device 902. The fuse data is preferably stored in an area to which it is impossible to access from the host device 902. The fuse data is preferably assigned to, for example, a storage place in the secret data area 932 to be stored.

The protected data area 933 stores important data. The protected data area 933 is an area to which it is possible to access only when the validity of the host device 902 is demonstrated by two-way authentication with the host device 902 connected to the memory card 901.

The user data area 934 stores user data. The user data area 934 is an area which can be freely accessed and used by a user.

Further, the memory card 901 according to the present example includes, as operation modes, for example, an SD mode and an SPI mode. Moreover, the SD mode is divided into an SD4bit mode and an SD1bit mode. One example of assignment of signals with respect to the signal pins according to the operation modes is shown in FIG. 37.

As shown in FIG. 37, in an SD mode, the memory card 901 is set to be in an SD4bit mode or an SD1bit mode by a bus width changing command from the host device 902.

Here, to focus on the four data 0 pin (DAT0) to data 3 pin (DAT3), in an SD4bit mode in which data transfer is carried out in units of 4-bit width, all the four data 0 pin to data 3 pin are used for the data transfer.

In an SD1bit mode in which data transfer is carried out in units of 1-bit width, only the data 0 pin (DAT0) is used for the data transfer, and the data 1 pin (DAT1) and the data 2 pin (DAT2) are not used. Further, the data 3 pin (DAT3) is used for, for example, asynchronous interrupt from the memory card 901 to the host device 902, or the like.

In an SPI mode, the data 0 pin (DAT0) is used for a data signal line (DATAOUT) from the memory card 901 to the host device 902. The command pin (CMD) is used for a data signal line (DATA IN) from the host device 902 to the memory card 901. The data 1 pin (DAT1) and the data 2 pin (DAT2) are not used. Further, in an SPI mode, the data 3 pin (DAT3) is used for transmission of a chip select signal CS from the host device 902 to the memory card 901.

A file system is mounted in the host device 902. The file system is a system which manages files (data) recorded in the memory, and shows a management area and management information provided to the memory. Further, in the file system, a preparing method of directory information such as files, folders, and the like in the memory, a moving method and a deleting method of files, folders, and the like, a recording mode of data, a place and a usage method of a management area, and the like are set.

A nonvolatile semiconductor memory according to the embodiment of the present invention can be used for such a memory card.

Further, in the seventh embodiment, the case has been shown in which the flash memory 911 and the card controller 912 are mounted together on the memory card. However, only the flash memory 911 may be mounted on the memory card, and the card controller 912 may be mounted on the host device side into which the memory card is installed. Further, the case has been shown in which a flash memory and a controller controlling the flash memory are separate chips 911 and 912. However, a flash memory and a controller controlling the flash memory may be mounted on one chip.

Further, the above described embodiments include the following aspects.

(1) A semiconductor integrated circuit device comprising:
a memory cell array into which a nonvolatile semiconductor memory is integrated, and which includes a plurality of blocks;
a storage unit which includes a block replacement information registration area with which it is possible to register block replacement information including address information of a defective block among said plurality of blocks, and a bad block information registration area with which it is possible to register bad block information including address information of a bad block;
a block replacement information register group into which the block replacement information is set; and
a bad block flag register group into which the bad block information is set,
wherein, during a boot sequence,
the block replacement information register group is set in accordance with the block replacement information read out of the storage unit, and
the bad block flag register group is set in accordance with both of the block replacement information and the bad block information read out of the storage unit.

(2) A semiconductor integrated circuit device comprising:
a memory cell array into which a nonvolatile semiconductor memory is integrated, and which includes a plurality of blocks;
a storage unit which includes a block replacement information registration area with which it is possible to register block replacement information including address information of a defective block among said plurality of blocks, and a bad block information registration area with which it is possible to register bad block information including address information of a bad block;
a block replacement information register group into which the block replacement information is set;
a bad block flag register group into which the bad block information is set;
a block redundancy judgment circuit which compares an inputted block address and the block replacement information set in the block replacement information register, and which can transfer an access destination to a redundant block serving as a replacement destination from the defective block when the defective block is accessed;
a row decoder with a voltage restraining function which can restrain a voltage applied to a word line of the bad block in accordance with the bad block information set in the bad block flag register group when the bad block is accessed;
a power supply detecting circuit which detects power-on; and
a sequencer which executes a boot sequence after the power supply detecting circuit detects power-on,
wherein, during a boot sequence,
the block replacement information register group is set in accordance with the block replacement information read out of the storage unit, and
the bad block flag register group is set in accordance with both of the block replacement information and the bad block information read out of the storage unit.

(3) The semiconductor integrated circuit device according to the aspects (1) and (2), further comprising:
a block address register which retains the inputted block address; and
an internal bus which electrically connects the storage unit to the block replacement information register group and the block address register, and electrically connects the block replacement information register group to the block address register, wherein, during the boot sequence, the address information of the defective block included in the block replacement information which is set in the block replacement information register group is transferred to the block address register via the internal bus, and the bad block flag register group is selected in accordance with the address information of the defective block transferred to the block address register, and is set, and the address information of the bad block included in the bad block information which is registered with the bad block information registration area of the storage unit is transferred to the block address register via the internal bus, and the bad block flag register group is selected in accordance with the address information of the bad block transferred to the block address register, and is further set.

(4) The semiconductor integrated circuit device according to the aspects (1) and (2), further comprising:

a block address register which retains the inputted block address; and an internal bus which electrically connects the storage unit to the block replacement information register group and the block address register, wherein, during the boot sequence, the address information of the defective block included in the block replacement information which is registered with the block replacement information registration area of the storage unit is transferred in parallel to the block replacement information register group and the block address register via the internal bus, and the bad block flag register group is selected in accordance with the address information of the defective block transferred to the block address register, and is set, and the address information of the bad block included in the bad block information which is registered with the bad block information registration area of the storage unit is transferred to the block address register via the internal bus, and the bad block flag register group is selected in accordance with the address information of the bad block transferred to the block address register, and is further set.

(5) The semiconductor integrated circuit device according to the aspects (1) to (4), wherein the memory cell array includes a normal array portion including normal blocks which are not used as the redundant block, and a redundant array portion including redundant blocks which can be used as the redundant block, the bad block flag register is provided to the normal blocks included in the normal array portion and the redundant blocks included in the redundant array portion, and during the boot sequence, the block redundancy judgment circuit does not carry out transferring of an access destination while the bad block flag register group is set in accordance with the address information of the defective block, and carries out the transferring of an access destination while the bad block flag register group is set in accordance with the address information of the bad block.

(6) A semiconductor integrated circuit device comprising:

a memory cell array into which a nonvolatile semiconductor memory is integrated, and which includes a plurality of blocks;

a storage unit which includes information registration areas with which it is possible to register a plurality of information including base values;

a base register group which includes a plurality of base registers into which the base values of said plurality of information are set;

a first selection signal generating circuit which generates a first selection signal for selecting said plurality of base registers;

a raising register group which includes a plurality of raising registers into which a plurality of raising values are set; and a second selection signal generating circuit which generates a second selection signal for selecting said plurality of raising registers, wherein, during a boot sequence, after the base values of said plurality of information are set into the base register group, logical operation of a base value set into a base register selected by the first selection signal and a raising value set into a raising register selected by the second selection signal is carried out, and a result of the logical operation is returned to the base register selected by the first selection signal.

(7) A semiconductor integrated circuit device comprising:

a memory cell array into which a nonvolatile semiconductor memory is integrated, and which includes a plurality of blocks;

a storage unit which includes a trimming information registration area with which it is possible to register a plurality of trimming information including base values;

a base register group which includes a plurality of base registers into which the base values of said plurality of trimming information are set;

a first selection signal generating circuit which generates a first selection signal for selecting said plurality of base registers;

a raising register group which includes a plurality of raising registers into which a plurality of raising values are set;

a second selection signal generating circuit which generates a second selection signal for selecting said plurality of raising registers; and an arithmetic and logical unit which carries out logical operation of the base values set into the base registers, and the raising values set into the raising registers, wherein, after the base values of said plurality of trimming information are set into the base register group, logical operation of a base value set into a base register selected by the first selection signal and a raising value set into a raising register selected by the second selection signal is carried out by the arithmetic and logical unit, and a calculated result by the arithmetic and logical unit is returned to the base register selected by the first selection signal.

(8) The semiconductor integrated circuit device according to the aspect (7), further comprising:

a power supply detecting circuit which detects power-on; and a sequencer which executes a boot sequence after the power supply detecting circuit detects power-on, wherein, during a boot sequence, after the base values of said plurality of trimming information are set into the base register group, logical operation of a base value set into a base register selected by the first selection signal and a raising value set into a raising register selected by the second selection signal is carried out by the arithmetic and logical unit, and a calculated result by the arithmetic and logical unit is returned to the base register selected by the first selection signal.

(9) The semiconductor integrated circuit device according to the aspects (6) to (8), further comprising:

a calculated result register which retains the calculated result by the arithmetic and logical unit; and an internal bus which electrically connects the storage unit to the base register group, electrically connects the base register group to the arithmetic and logical unit, and electrically connects the calculated result register to the base register group, wherein, during the boot sequence, the base value of the base register which is set into the base register group, and which is selected by the first selection signal is transferred to the arithmetic and logical unit via the internal bus, and is calculated with the raising value of the raising register selected by the second selection signal, and thereafter, is retained in the calculated result register, and the calculated result retained in the calculated result register is set into the base register selected by the first selection signal via the internal bus.

(10) The semiconductor integrated circuit device according to the aspects (6) to (9), wherein the number of raising registers included in the raising register group is less than the number of base registers included in the base register group.

(11) A semiconductor integrated circuit device comprising a memory cell array in which nonvolatile memory cells are disposed, wherein the memory cell array includes (M+N) blocks, and the memory cell array can be switched to one of a first type in which M blocks are in a normal array, and N blocks are in a redundant array, and a second type in which all the (M+N) blocks are in a normal array (however, M and N are natural numbers).

(12) The semiconductor integrated circuit device according to the aspect (11), wherein the switching is carried out by an input of commands.

(13) A semiconductor integrated circuit device comprising:

a memory cell array into which a nonvolatile semiconductor memory is integrated, which includes a plurality of blocks, and which includes a normal array including blocks which are not used as a redundant block, and a redundant array including blocks which can be used as the redundant block;

a storage unit which includes a block replacement information registration area with which it is possible to register block replacement information including address information of a defective block among said plurality of blocks, and a bad block information registration area with which it is possible to register bad block information including address information of a bad block;

a block replacement information register group into which the block replacement information is set during a boot sequence;

a bad block flag register group into which the bad block information is set during the boot sequence;

a block redundancy judgment circuit which compares an inputted block address and the block replacement information set in the block replacement information register, and which can transfer an access destination to a redundant block serving as a replacement destination from the defective block when the defective block is accessed;

a row decoder with a voltage restraining function which can restrain a voltage applied to a word line of the bad block in accordance with the bad block information set in the bad block flag register group when the bad block is accessed;

a power supply detecting circuit which detects power-on;

a sequencer which executes the boot sequence after the power supply detecting circuit detects power-on; and a command decoder which decodes commands, wherein the commands include a first command designating a first type in which the memory cell array is operated so as to be divided into a normal array and a redundant array, and a second command designating a second type in which the entire memory cell array is operated as a normal array, and the command decoder permits an operation of transferring an access destination of the block redundancy judgment circuit during setting of the block replacement information register group during the boot sequence, and in operation when the first command is received, and prohibits the operation of transferring an access destination of the block redundancy judgment circuit in operation when the second command is received.

(14) The semiconductor integrated circuit device according to the aspects (1) to (13), wherein the memory cell array includes a NAND type memory cell unit as the nonvolatile semiconductor memory.

In accordance with the above-described present embodiments, it is possible to provide a semiconductor integrated circuit device having a nonvolatile semiconductor memory which can efficiently use an internal ROM storing information utilized during a boot sequence.

In accordance with the above-described present embodiments, it is possible to provide a semiconductor integrated circuit device having a nonvolatile semiconductor memory in which it is possible to reduce the number of registers into which information read out of an internal ROM is stored during a boot sequence.

The present invention has been described above on the basis of the embodiments. However, the embodiment of the present invention is not limited to the above-described embodiments, and the present invention can be modified in various ways within a range which does not deviate from the spirit of the present invention.

Further, inventions at various stages are included in the above-described embodiments, and inventions at various stages can be extracted by appropriately combining a plurality of structural requirements disclosed in the above-described embodiments.

Further, the above-described embodiments have been described on the basis of the examples in which the present invention is applied to a NAND type flash memory. However, the present invention is not limited to a NAND type flash memory. For example, the above-described embodiments can be applied to, for example, a memory system of a processor or a memory system of a system LSI, as a memory system of a semiconductor integrated circuit device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a memory cell array into which a nonvolatile semiconductor memory connected to a word line is integrated, and which includes a plurality of blocks;
a row decoder which selects the word line;
a column control circuit which carries out writing of data into the nonvolatile semiconductor memory and reading data from the nonvolatile semiconductor memory;

a storage unit which includes information registration areas with which it is possible to register a plurality of information including base values;

a first register group which includes a plurality of first registers into which the base values of said plurality of information are set;

a first selection signal generating circuit which generates a first selection signal for selecting said plurality of first registers;

a second register group which includes a plurality of second registers into which a plurality of raising values are set; and a second selection signal generating circuit which generates a second selection signal for selecting said plurality of second registers, wherein, after the base values of said plurality of information are set into the first register group, operation of a base value set into a first register selected by the first selection signal and a raising value set into a second register selected by the second selection signal is carried out, and a result of the operation is returned to the first register selected by the first selection signal.

2. The device according to claim 1, wherein the base values in the first registers and the raising values in the second registers control a write operation of the data.

3. The device according to claim 1, wherein the number of the first registers is the same as the number of the second registers.

4. The device according to claim 1, wherein the number of the second registers is less than the number of the first registers.

5. The device according to claim 1, wherein the memory cell array includes a NAND type memory cell unit as the nonvolatile semiconductor memory.

6. A method for writing data into a nonvolatile semiconductor memory comprising:

writing a first data into the nonvolatile semiconductor memory according to a first information in a first register; and writing a second data into the nonvolatile semiconductor memory according to the first information in the first register and a second information in a second register.

7. The method according to claim 6, wherein in case of a failure of writing the first data, writing the second data is carried out, and the second data is same data as the first data which is failed to be written into the nonvolatile semiconductor memory.

8. The method according to claim 6, further comprising:

performing a operation of the first information and second information; and setting a result of the operation into one of the first register and second register, wherein the writing the second data is carried out according to the result of the operation.

9. The method according to claim 6, wherein the first data and second data is written in accordance with an instruction given by a controller.

10. The method according to claim 6, wherein the first register which is used at the writing the first data is selected according to an address of the nonvolatile semiconductor memory.

11. The method according to claim 6, further comprising performing an operation of the first information and second information; and setting a result of the operation into one of the first register and second register, wherein the writing the second data is carried out according to the result of the operation, in case of a failure of writing the first data, writing the second data is carried out, the second data is same data as the first data which is failed to be written into the nonvolatile semiconductor memory, the first data and second data is written in accordance with an instruction given by a controller, and the first register which is used at writing the first data is selected according to an address of the nonvolatile semiconductor memory.

12. The method according to claim 10, wherein the address is a column address of the nonvolatile semiconductor memory.

13. The method according to claim 6, wherein the memory cell array includes a NAND type memory cell unit as the nonvolatile semiconductor memory.

14. A memory card comprising:

the semiconductor integrated circuit device recited in claim 1; and a controller which controls the semiconductor integrated circuit device.

15. The card according to claim 14, wherein the controller includes a first interface which carries out a interface processing between the controller and a host device;

a processing unit which receives a command from the host device via the first interface and which executes a processing according to the command; and a second interface which carries out a interface processing between the controller and the semiconductor integrated circuit device.

16. The card according to claim 15, wherein the controller includes a third register which stores a relative card address.

* * * * *